(12) United States Patent
Lin et al.

(10) Patent No.: US 7,873,928 B2
(45) Date of Patent: Jan. 18, 2011

(54) HIERARCHICAL ANALOG IC PLACEMENT SUBJECT TO SYMMETRY, MATCHING AND PROXIMITY CONSTRAINTS

(75) Inventors: Po-Hung Lin, Jhubei (TW); Wei-Chung Chao, Hsinchu (TW); Shyh-Chang Lin, Hsinchu (TW)

(73) Assignee: Springsoft USA, Inc., San Jose, CA (US)

( * ) Notice: Subject to any disclaimer, the term of this patent is extended or adjusted under 35 U.S.C. 154(b) by 0 days.

(21) Appl. No.: 12/472,323

(22) Filed: May 26, 2009

(65) Prior Publication Data

US 2009/0235219 A1 Sep. 17, 2009

Related U.S. Application Data

(63) Continuation-in-part of application No. 11/930,992, filed on Oct. 31, 2007.

(51) Int. Cl.
*G06F 17/50* (2006.01)
(52) U.S. Cl. ............................................. 716/9; 716/10
(58) Field of Classification Search ........................ None
See application file for complete search history.

(56) References Cited

U.S. PATENT DOCUMENTS

| | | | |
|---|---|---|---|
| 6,550,046 B1 * | 4/2003 | Balasa et al. ..................... | 716/8 |
| 7,093,220 B2 * | 8/2006 | Fallon et al. ..................... | 716/10 |
| 7,739,646 B2 * | 6/2010 | Lin et al. ......................... | 716/11 |
| 2008/0092099 A1 * | 4/2008 | Lin et al. ......................... | 716/8 |

OTHER PUBLICATIONS

Lin et al., "Analog Placement Based on Symmetry-Island Formulation," IEEE Trans. on CAD of ICs and Systems, vol. 28, No. 6, Jun. 2009, pp. 791-804.*
Lin et al., "Analog Placement Based on Novel Symmetry-Island Formulation," DAC '07, Jun. 4-7, 2007, pp. 465-470.*
Balasa, "Modeling Non-Slicing Floorplans with Binary Trees," 2000 IEEE, pp. 13-16.*

(Continued)

*Primary Examiner*—Leigh Marie Garbowski
(74) *Attorney, Agent, or Firm*—Chernoff, Vilhauer, McClung & Stenzel

(57) ABSTRACT

A placement tool generates an optimal placement for a plurality of device modules within an analog integrated circuit (IC) subject to device matching, symmetry, and proximity constraints by first defining a multiple-level hierarchy of constraint groups, wherein each constraint group consists of elements that are subject to one of the placement constraints. Each element of each constraint group consists of either of one of the device modules or another one of the constraint groups residing at a lower level of the hierarchy. The tool then generates a hierarchical B*-tree representation of a trial placement for the IC including a separate node representing each constraint group of the hierarchy and a separate node for each of device module not included in any of the constraint groups. Each node representing a constraint group defines relative positions within the IC of each the device modules or lower level constraint groups forming the constraint group that are consistent with the placement constraint on the constraint group. The placement tool iteratively perturbs the hierarchical B*-tree to generate a sequence of trial placements for the IC design and then evaluates a cost function for each trial placement to select a best one of the trial placements as the optimal trial placement.

15 Claims, 14 Drawing Sheets

OTHER PUBLICATIONS

Balasa et al., "Efficient Solution Space Exploration Based on Segment Trees in Analog Placement with Symmetry Constraints," 2002 IEEE, pp. 497-502.*
Balasa et al., "Symmetry Within the Sequence-Pair Representation in the Context of Placement for Analog Design," IEEE Trans. on CAD of ICs and Systems, vol. 19, No. 7, Jul. 2000, pp. 721-731.*
Balasa et al., "On the Exploration of the Solution Space in Analog Placement With Symmetry Constraints," IEEE Trans. on CAD of ICs and Systems, vol. 23, No. 2, Feb. 2004, pp. 177-191.*
Balasa et al., "Using Red-Black Interval Trees in Device-Level Analog Placement with Symmetry Constraints," 2003 IEEE, pp. 777-782.*
Balasa, "Device-Level Placement for Analog Layout: An Opportunity for Non-Slicing Topological Representations," 2001 IEEE, pp. 281-286.*
Chang et al., "B*-Trees: A New Representation for Non-Slicing Floorplans," DAC 2000, pp. 458-463.*
Lin et al., A Matching-based Placement and Routing System for Analog Design, 2007 IEEE, 4 pages.*
Ma et al., "Analog Placement with Common Centroid Constraints," 2007 IEEE, pp. 579-585.*
Kouda et al., "Improved Method of Cell Placement with Symmetry Constraints for Analog IC Layout Design," ISPD '06, Apr. 9-12, 2006, pp. 192-199.*
Chen et al., "Modern Floorplanning Based on B*-Tree and Fast Simulated Annealing," IEEE Trans. on CAD of ICs and Systems, No. 25, vol. 4, Apr. 2006, pp. 637-650.*
Cohn et al "KOAN/ANAGRAM II: New Tools for Device-Level Analog Placement and Routing," IEEE Journal of Solid-State Circuits, vol. 26, No. 3, Mar. 1991, pp. 330-342.*
He et al., "Analog Placement Design with Constraints of Multiple Symmetry Groups," Canadian Conference on Electrical and Computer Engineering, May 3-6, 2009, pp. 1204-1207.*
Koda et al., "Linear Programming-Based Cell Placement With Symmetry Constraints for Analog IC Layout," IEEE Trans. on CAD of ICs and Systems, vol. 26, No. 4, Apr. 2007, pp. 659-668.*
Krishnamoorthy et al., "Topological Placement with Multiple Symmetry Groups of Devices for Analog Layout Design," 2007 IEEE, pp. 2032-2035.*
Lin et al., "LAKE: A Performance-Driven Analog CMOS Cell Layout Generator," 1994 IEEE, pp. 564-569.*
Lampaert et al., "A Performance-Driven Placement Tool for Analog Integrated Circuits," IEEE Journal of Solid-State Circuits, vol. 30, No. 7, Jul. 1995, pp. 773-780.*
Lin et al., Placement with Symmetry Constraints for Analog Layout Design Using TCG-S, ASP-DAC 2005EE, pp. 1135-1138.*
Lin et al., 'Module placement with boundary constraints using B*-trees, IEE Proc.-Circuits, Devices, Syst., vol. 149, No. 4, Aug. 2002, pp. 251-256.*
Lin et al., "Analog Placement Based on Hierarchical Module Clustering," DAC 2008, Jun. 8-13, pp. 50-55.*
Malavasi et al., "Automation of IC Layout with Analog Constraints," IEEE Trans. on CAD of ICs and Systems, vol. 15, No. 8, Aug. 1996, pp. 923-942.*
Prieto et al., "A Performance-Driven Placement Algorithm with Simultaneous Place&Route Optimization for Analog ICs," 1997 IEEE, pp. 389-394.*
Tam et al., "Analog Placement with Symmetry and Other Placement Constraints," ICCAD '06, pp. 349-354.*
Wu et al., "Rectilinear Block Placement Using B*-Trees," ACM Trans. on Design Automation of Electronic Systems, vol. 8, No. 2, Apr. 2003, pp. 188-202.*
Wu et al., "Placement with Alignment and Performance Constraints Using the B*-tree Representation,"2004 Proc. IEEE Int'l Conference on Cumputer Design (ICCD'04), 4 pages.*

* cited by examiner

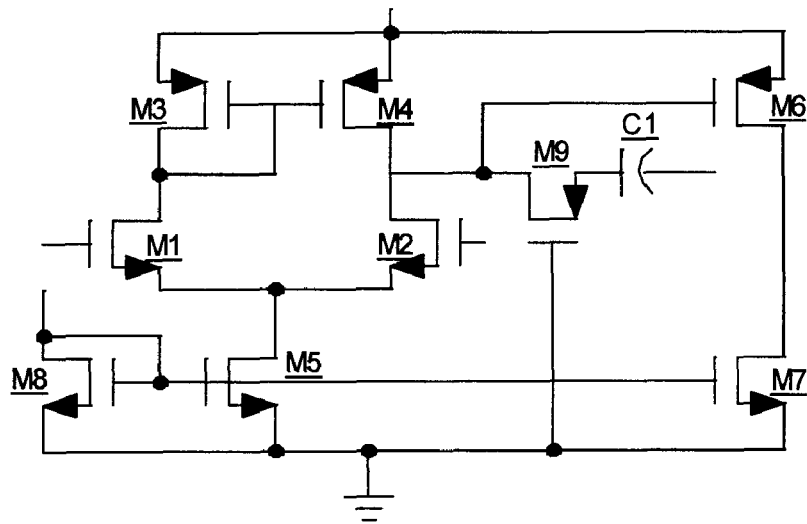
FIG. 1
(PRIOR ART)
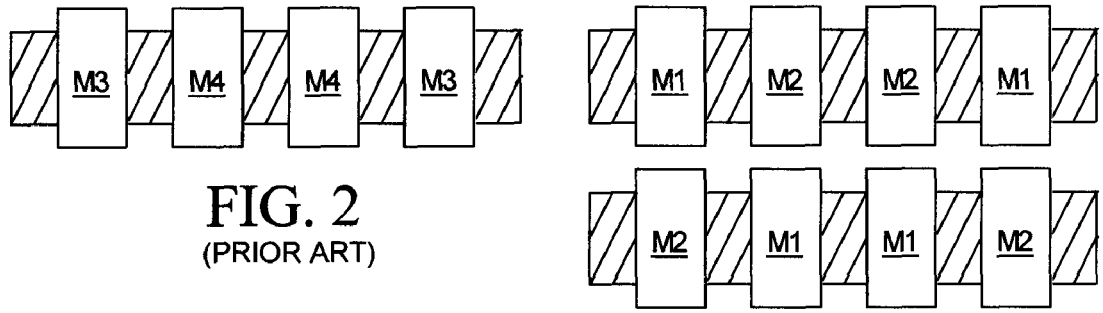
FIG. 2
(PRIOR ART)
FIG. 3
(PRIOR ART)
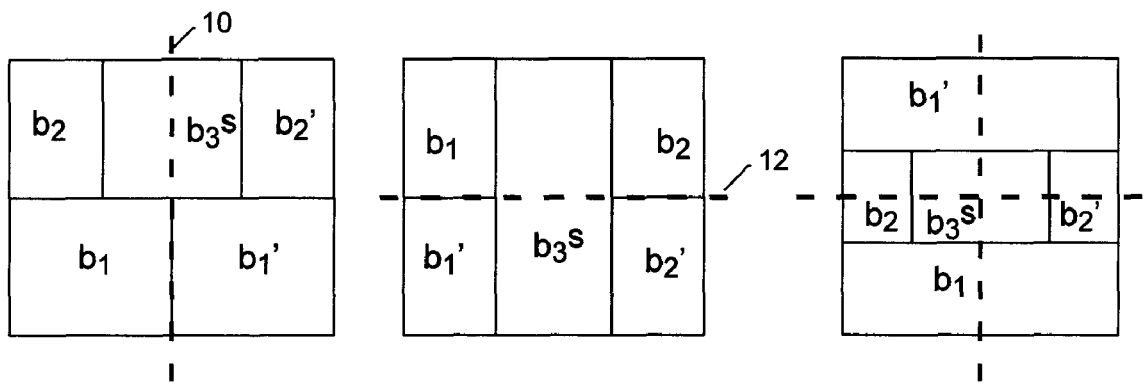
FIG. 4
(PRIOR ART)
FIG. 5
(PRIOR ART)
FIG. 6
(PRIOR ART)

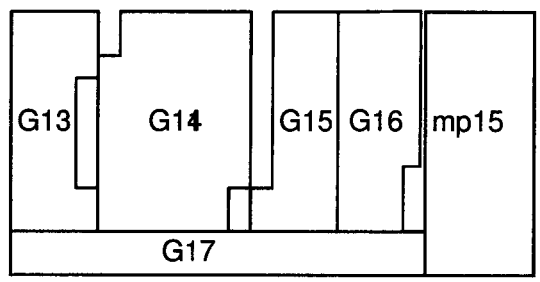
FIG. 42
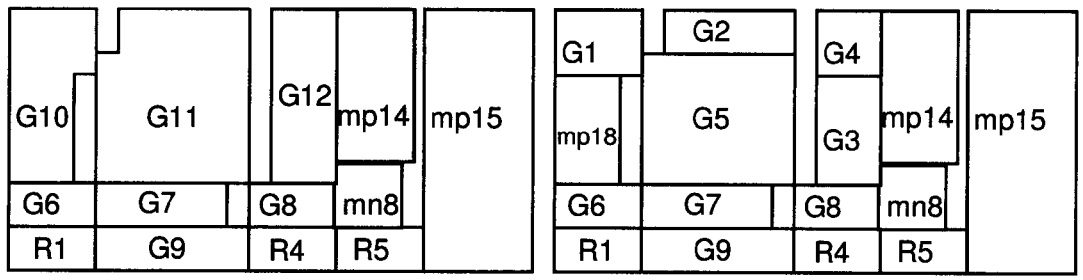
FIG. 43          FIG. 44
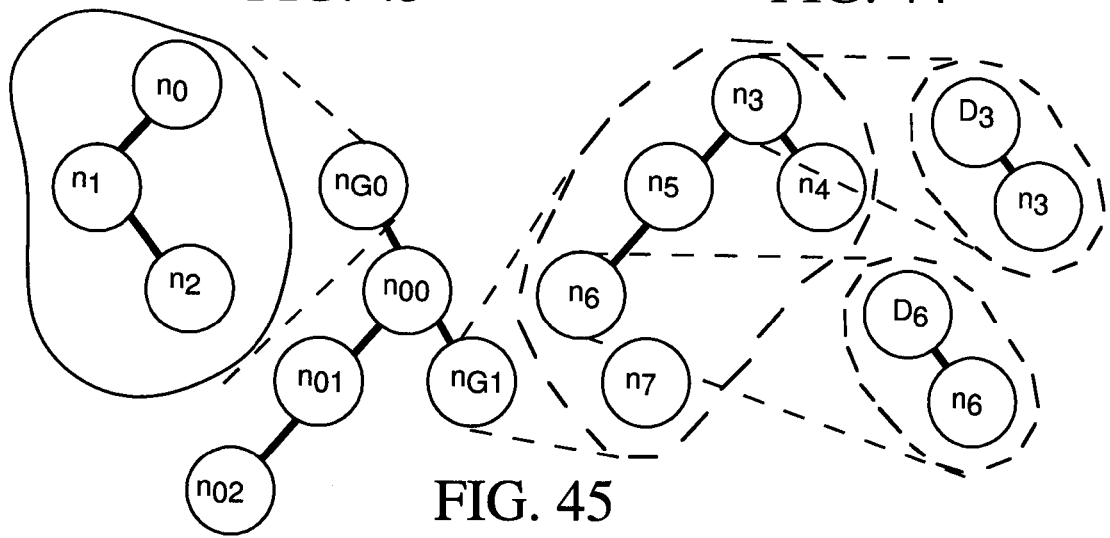
FIG. 45
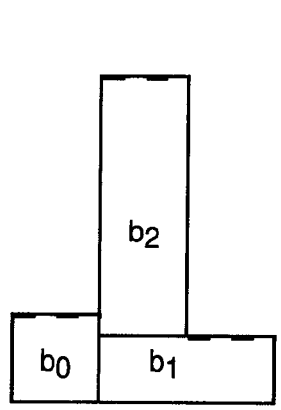 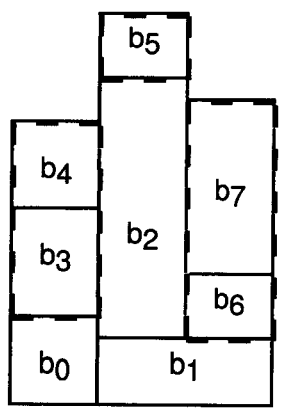 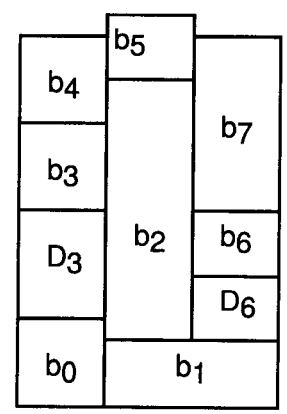
FIG. 46    FIG. 47    FIG. 48

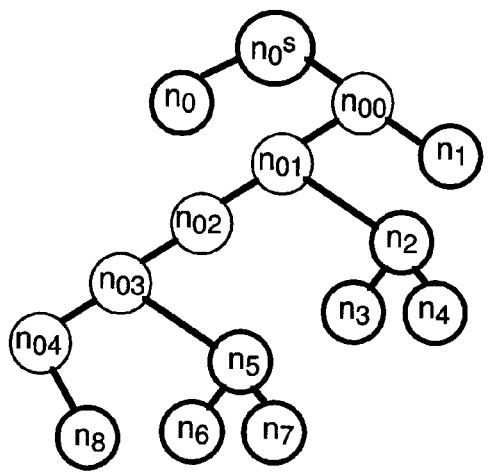
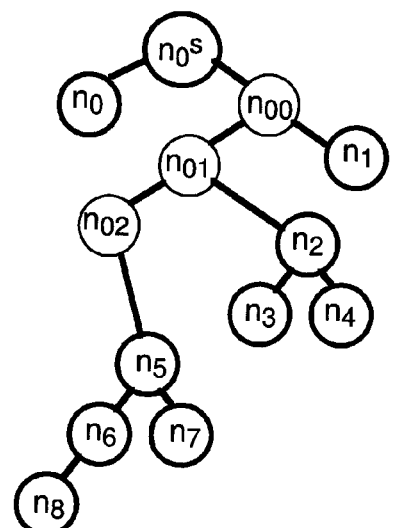
FIG. 64  FIG. 65
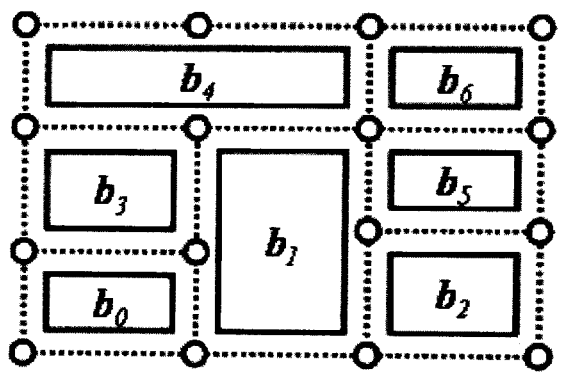
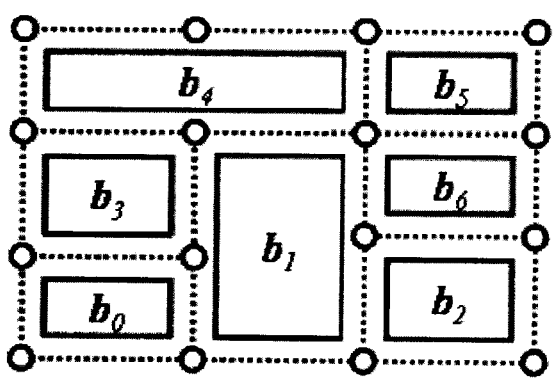
FIG. 67A  FIG. 67B

HIERARCHICAL ANALOG IC PLACEMENT SUBJECT TO SYMMETRY, MATCHING AND PROXIMITY CONSTRAINTS

CROSS-REFERENCE TO RELATED APPLICATION

This is a continuation-in-part of U.S. patent application Ser. No. 11/930,992 filed Oct. 31, 2007.

BACKGROUND OF THE INVENTION

1. Field of the Invention

The invention relates in general to a system for determining positions for device modules within an analog integrated circuit (IC) and in particular for a system for positioning device modules within an IC containing symmetric circuits.

2. Description of Related Art

A netlist describes an analog IC as including a set of interconnected device modules such as transistors, capacitors, resistors and other devices. A computer-based placement tool processes a netlist to determine a suitable position and orientation within the IC for each device module. To reduce the effect of parasitic mismatches and circuit sensitivity to thermal gradients or process variations, a placement tool will try to place pairs of matching device modules close to one another and symmetrically with respect to one another with respect to a common axis. The circuit designer will normally provide the placement tool with a set of symmetry constraints identifying each group of device modules (a "symmetry group") that is to have a symmetric layout, identifying each pair of matching devices (a "symmetry pair") within each symmetry group that is to be placed symmetrically about an axis of the symmetry group, and identifying each internally symmetric device module (a "self-symmetry device module") within the group that is to be centered on the symmetry group axis. The circuit designer also will provide the placement tool with a set of device matching and proximity constraints.

When generating a placement plan, a placement tool typically treats each device module of an IC as a rectangle that is large enough to accommodate the device module and to provide some additional space around the device module for routing the conductors ("nets") that are to interconnect device modules. The problem of selecting a position for each device module of the IC becomes one of finding a non-overlapping position within a plane for each of a set of rectangles of various sizes and shapes in a way that satisfies various matching, symmetry, proximity and other constraints on device module placement.

FIG. 4 shows a placement for a symmetry group that is symmetric about a vertical axis 10 and FIG. 5 shows a placement for a symmetry group that is symmetric about a horizontal axis 12. The following notation is used in FIGS. 4 and 5 and elsewhere in this specification.

S a symmetry group
$b_i$ a device module
$(b_i, b_i')$ a symmetry pair
$b_i^s$ a self-symmetry device module The following expression can represent the symmetry group S of FIG. 4:

$$S=((b_1,b_1'),(b_2,b_2'),b_3^s)$$

A "device matching constraint" forces a common gate orientation and an interdigital placement on a group of devices. Any group of devices subject to a device matching constraint is called a "matching group" and a placement tool can recognize a matching group within a netlist when devices types, sizes and interconnections match a predetermined pattern. FIG. 1 is a schematic diagram of an example two-stage operational amplifier including a set of transistors M1-M9, and a capacitor C1. FIG. 2 illustrates an inter-digitized type placement of a matching group formed by transistors M3 and M4 of FIG. 1. FIG. 3 Illustrates a common-centroid type placement of a matching group formed by transistors M1 and M2 of FIG. 1.

A "proximity constraint" limits a particular group of devices to a connected placement with the devices placed near one another, for example, so that they share a common substrate/well region, so that they are surrounded by a common guard ring, or so that they can be interconnected by short wire. A group of devices subject to a proximity constraint is called a "proximity group". For example, FIG. 9 illustrates a placement of a PMOS proximity group 14 sharing a common N-well 15 and an NMOS proximity group 16 formed in a p-substrate 17. Proximity groups may be hierarchical. For example, proximity groups 14 and 16 of FIG. 9 can be designated as a higher-level proximity group to ensure they are placed near one another when the two lower-level proximity groups must be interconnected by short wires.

A placement plan for an analog IC must satisfy other constraints in addition to symmetry constraints including, for example, constraints on available space and constraints on positions and orientations of certain device modules. Although many different IC placements may satisfy all constraints, designers consider some placements to be better than others based on a number of factors. For example, designers usually consider a placement that positions highly interconnected device modules near one another to be better because it reduces the lengths of the net needed to interconnect device module terminals, thereby making it more likely that a computer-based routing tool will be able to route the nets between device modules positioned in accordance with the placement plan. A more compact placement may be considered better when it can result in a smaller or faster IC. Placement tools commonly generate several different trial placements and evaluate each trial placement based on a "cost function" having a value that is a weighted sum of various attributes of the trial placement such as variables representing estimated lengths of the nets ("wire lengths"), the total placement area and other factors. The trial placement having the lowest cost function value is selected as the most suitable placement.

One way to generate a large number of trial placements is to start with an initial placement and then iteratively perturb the initial placement by changing positions and orientations of the device modules to produce many trial placements, and to evaluate a cost function for each trial placement to find a best placement. Much prior work in this area has been directed toward developing approaches for reducing the amount of processing time needed to arrive at a low cost placement solution while satisfying the symmetry constraints.

One way to reduce processing time is to represent a trial placement in a way that allows a placement tool to quickly and easily perturb a trial placement to produce a different placement. While it is possible for a placement tool to employ a topological representation of a trial placement that directly tracks the coordinates of each rectangle within an IC layout, it is difficult and time-consuming for a placement tool to iteratively perturb such a topological representation of a trial placement in order to create other trial placements because a change to coordinates of any one rectangle can have a ripple effect on coordinates of every other rectangle. The article, "B*-Trees: A New Representation For Non-slicing Floorplans," Proc. DAC, pp. 458-463, 2000, describes a placement method employing a binary tree ("B*-tree") to represent a compacted placement in which no device module can move any further down or to the left. A B*-tree is a convenient way for a placement tool to represent a placement because it is relatively easy for the tool to alter a placement by altering the B*-tree representation. FIG. 12 shows a compacted placement of a set of 10 device modules $b_0$-$b_9$ and FIG. 13 shows a corresponding B*-tree representation of that placement wherein every node $n_i$ of the B*-tree corresponds to a device module $b_i$ of the compacted placement. The root $n_0$ of the B*-tree of FIG. 2B corresponds to the device module $b_0$ on the bottom-left corner of the placement of FIG. 12. For each node $n_i$ corresponding to a device module $b_i$, the left child of node $n_i$ represents the lowest, adjacent device module on the right side of device module $b_i$, while the right child of node $n_i$ represents the first device module above $b_i$ having the same horizontal coordinate within the placement plane. (Herein we refer to the "horizontal" direction in an IC placement plan such as that depicted in FIG. 12 as being directed toward the left and right sides of the figure and to the "vertical" direction as being directed toward the top and bottom of the figure.) The width and height dimensions ($w_i$, $h_i$) of the rectangular device module $b_i$ associated with each node $n_i$ can be stored in a database.

Given a B*-tree representation of a compacted placement, a placement tool can, when necessary, calculate the coordinate ($x_i$, $y_i$) of each device module through an ordered tree traversal. Suppose the device module $b_i$, represented by the node $n_i$, has the bottom-left coordinate ($x_i$, $y_i$), width $w_i$, and height $h_i$. Then for the left child, $n_j$, of $n_i$, $x_j$=$x_i$+$w_i$; for the right child, $n_k$, of $n_i$, $x_k$=$x_i$. A placement tool in accordance with the invention maintains a contour structure to calculate y-coordinates. Thus, starting from the root node, whose bottom-left coordinate is (0, 0), then visiting the root's left subtree, and then its right subtree, the tool can use a pre-order tree traversal procedure (B*-tree packing) to calculate all coordinates of the device modules in the placement.

A B*-tree is a convenient way for a placement tool to represent a compacted trial placement that allows it to quickly perturb a trial placement by modifying its B*-tree representation and to quickly determine whether the placement satisfies some kinds of constraints by processing its B*-tree representation. For example it is possible to determine from a B*-tree representation whether a set of device modules forming a symmetry group will satisfy symmetry constraints on the symmetry group. Once a placement tool has generated a B*-tree representation of a new trial placement and has processed the B*-tree representation to determine whether the trial placement it specifies will satisfy various symmetry and other constraints, the placement tool can quickly convert the B*-tree representation of the trial placement into physical locations that will enable it to conveniently determine whether the trial placement satisfies other constraints and to evaluate the cost function for that particular trial placement. However, a placement tool employing B*-tree placement representations can still require substantial amounts of processing time to find an optimal placement particularly for large analog ICs that include several symmetry groups because the solution space that must be searched can still be quite large.

U.S. Pat. No. 6,550,046, issued Apr. 15, 2003 to Balasa et al describes an automated method for packing cells in an analog IC layout including symmetry groups that are subject to symmetry constraints. Symmetry constraints are defined for each symmetry group, which are represented by sequence-pairs. To reduce the solution space, the initial sequence pair encoding is required to be symmetry-feasible so that the search subspace is therefore limited to symmetry-feasible sequence-pairs. Nevertheless, the solution space is also quite large because the sequence-pair representation does not preclude the devices in symmetry groups from being placed far apart, which will not be considered a good placement.

What is needed is an approach to analog IC placement that limits the search space to trial placements wherein device modules forming each symmetry group reside near one another and wherein each symmetry group satisfies all symmetry constraints.

SUMMARY OF THE INVENTION

A placement tool in accordance with the invention generates an optimal placement for a plurality of device modules within an analog integrated circuit (IC) subject to device matching, symmetry, and proximity constraints.

The placement tool initially processes the IC design to define a multiple-level hierarchy of constraint groups, wherein each constraint group consists of elements that are subject to one of the placement constraints. Each element of each constraint group consists of either of one of the device modules or another one of the constraint groups residing at a lower level of the hierarchy.

The placement tool then generates a hierarchical B*-tree representation of a trial placement for the IC including a separate node representing each constraint group of the hierarchy and a separate node for each of device module not included in any of the constraint groups. Each node representing a constraint group defines relative positions within the IC of the elements forming the constraint group that are consistent with the placement constraint on the constraint group.

The placement tool iteratively perturbs the hierarchical B*-tree to generate a sequence of trial placements for the IC design and then evaluates a cost function for each trial placement to select a best one of the trial placements as the optimal trial placement.

BRIEF DESCRIPTION OF THE DRAWINGS

FIG. 1 is a schematic diagram of a prior art operational amplifier circuit.

FIGS. 2 and 3 are simplified plan views of prior art placements for the circuit of FIG. 1.

FIGS. 4-6 are simplified plan views of prior art placements exhibiting various types of symmetry.

FIGS. 42-44 are simplified, progressively more detailed plan views of a placement in accordance with the HB*-tree representation of FIG. 41.

FIG. 45 depicts an HB*-tree representing the placement of two proximity groups.

FIGS. 46-48 are simplified, progressively more detailed plan views of a placement in accordance with the HB*-tree representation of FIG. 45.

FIG. 64 depicts an HB*-tree representation of a symmetry group.

FIG. 65 depicts a perturbed version of the HB*-tree of FIG. 64.

FIGS. 67A and 67B show device placements of an IC with two proximity groups.

DETAILED DESCRIPTION OF THE INVENTION

Figure 7:
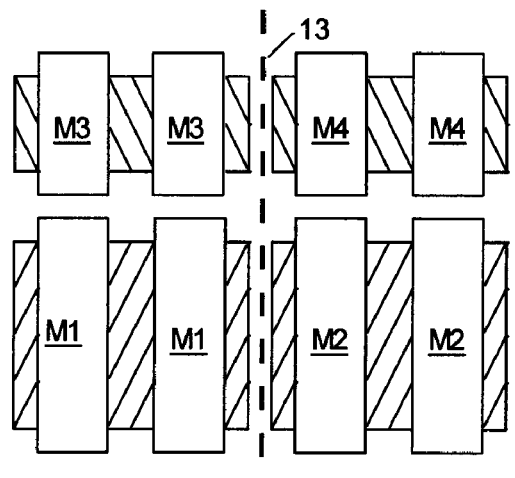
FIGS. 7 and 8 are simplified plan views of prior art symmetric transistor placements.

The invention relates to a method implemented by a placement tool for placing device modules within an analog integrated circuit (IC) layout. The invention can be implemented in the form of computer-readable media containing software which, when read and executed by a conventional computer, causes the computer to act as a placement tool carrying out the method in accordance with the invention. Suitable computer-readable media includes, but is not limited to, random access and read only memory, hard drives, compact disks and floppy disks. While a preferred embodiment of the invention described below incorporates the essential features of the invention, not all features of the preferred embodiment may be essential to the invention, and those of skill in the art will appreciate that other embodiments of the invention defined by the claims attached to this specification are possible.

An IC designer typically produces an analog or mixed-signal IC design in the form of a netlist describing the transistors and other devices to be included in the IC and indicating how the devices are to be interconnected by conductive nets. The designer then uses an automated placement tool to determine a position and orientation of each device within the IC and an automated routing tool to determine the layout of the nets that are interconnect the devices. Since device placement in analog and mixed-signal IC layouts impacts parasitic coupling and circuit performance, a placement tool can reduce unwanted parasitic coupling and other undesirable effects by insuring that particular groups of devices described by the netlist are positioned to satisfy various topological constraints including device matching constraints, symmetry constraints and proximity constraints.

Device Matching Constraints

A "device matching constraint" forces a common gate orientation and an interdigital placement on a group of devices. Any group of devices subject to a device matching constraint is called a "matching group" and a placement tool can recognize a matching group within a netlist when devices types, sizes and interconnections match a predetermined pattern. Device matching is taught, for example, in U.S. Patent Application Publication No. 20080092099 "Analog and mixed-signal IC layout system," dated Apr. 17, 2008, in the article "A matching-based placement and routing system for analog design," Proc. VLSI-DAT, pp. 16-19, 2007 by Lin et al; and in the article "Analog placement with common centroid constraints," appeared in Proc. ICCAD, pp. 579-585, 2007 by Ma et al., each of which are incorporated herein by reference.

FIG. 1 is a schematic diagram of an example two-stage operational amplifier including a set of transistors M1-M9, and a capacitor C1. Devices forming matching groups are usually divided into a set of smaller device components of similar dimension in physical layout that are placed in inter-digitized common-centroid style. FIG. 2 illustrates an inter-digitized type placement of a matching group formed by transistors M3 and M4 of FIG. 1. FIG. 3 Illustrates a common-centroid type placement of a matching group formed by transistors M1 and M2 of FIG. 1.

Symmetry Constraints

A "symmetry constraint" restricts a particular group of devices to a mirrored placement to reduce effects of parasitic mismatch in differential circuits such as current mirrors, differential pairs and the like. A group of devices subject to a symmetry constraint is called a "symmetry group" that is symmetrically placed with respect a central axis to form a "symmetry island", For example, FIGS. 4 and 5 depicts alternative placements of set of device modules including device modules b1, b2, b1', b2' and b3S. Device modules b1' and b2' are mirror images of device modules b1 and b2, respectively, and device module b3 is symmetric about horizontal and vertical axes 10 and 12. The placements of FIGS. 4 and 5 exhibit one-dimensional symmetry while the placement of FIG. 6 exhibits two-dimensional symmetry.

Figure 8:
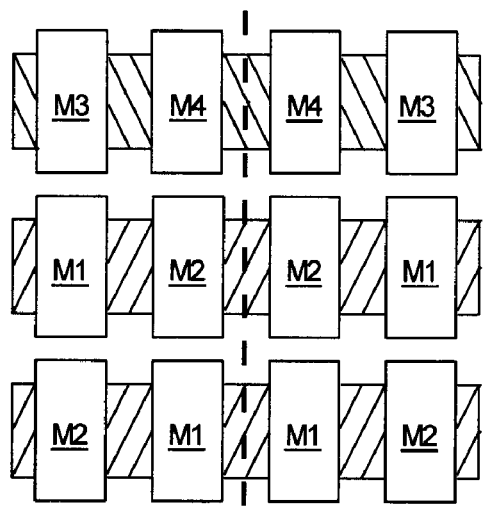

FIG. 7 shows how a symmetry group formed by transistors M1-M4 of FIG. 1 can be symmetrically placed about an axis 13 when the transistors are not subject to device matching constraints. A device can be assigned to more than one kind of constraint group. For example transistors M1-M4 can form a symmetry group, transistors M3 and M4 can form one matching group, and transistors M1 and M2 can form another matching group. FIG. 8 shows a placement for transistors M1-M4 satisfying both symmetry and device matching constraints.

Symmetry Islands

An analog IC layout design can include one or more sets of device modules, each exhibiting any of three symmetry types: one-dimensional ("1D") vertical symmetry, 1D horizontal symmetry, and two-dimensional ("2D") symmetry as illustrated by FIGS. 4-6, respectively. A symmetry group is a set of device modules subject to a symmetry constraint requiring them to be placed in accordance one of the three symmetry types. A "symmetry-pair" is two device modules of similar dimension and orientation included within a symmetry group that should be placed symmetrically with respect to a central horizontal and/or vertical axis of the symmetry group with one device module being the mirror image of the other. Pairs $(b_1, b_1')$ and $(b_2, b_2')$ of FIGS. 4-6 are symmetry pairs. A symmetry group $S_i=\{(b_1, b_1'), (b_2, b_2'), \ldots, (b_p, b_p'), b^s_1, b^s_2, \ldots, b^s_q\}$ consists of p symmetry pairs and q self-symmetry device modules. A "self-symmetry device module" is an internally symmetric device module that should have its center on the central horizontal and/or vertical symmetry axis of the area occupied by its symmetry group.

TABLE I

| | |
|---|---|
| $b_i$ | a device module that may be included in an IC |
| $S_i$ | a symmetry group |
| $(b_i, b_i')$ | a symmetry pair |
| $b_i^s$ | a self-symmetry device module. |
| $b^r$ | either a symmetry pair or self-symmetry module |

TABLE I-continued

| | |
|---|---|
| $n_i$ | a node in a B*-tree |
| $(x_i, y_i)$ | a center coordinate of module $b_i$ |
| $(w_i, h_i)$ | the width and height of module $b_i$ |
| $(x^\wedge_i, y^\wedge_i)$ | coordinates of the horizontal and/or vertical symmetry axis of symmetry group $S_i$ |

The placements depicted in FIGS. 4-6 include symmetry pairs $(b_1, b'_1)$ and $(b2, b_2')$ and a self-symmetry device module $b^s_3$.

Let $S=\{S_1, S_2 \ldots S_n\}$ be a set of n symmetry groups within an IC layout each of whose symmetry axis coordinates are $x^\wedge_i$, $y^\wedge_i$. A symmetry group $S_i=\{(b_1, b_1'), (b_2, b_2'), \ldots, (b_p, b_p'), b^s_1, b^s_2, \ldots, b^s_q\}$ consists of p symmetry pairs and q self-symmetry device modules. Let $(x_j, y_j)$ and $(x_j', y_j')$ denote the respective coordinates of the centers of two device modules $b_j$ and $b_j'$ in a symmetry pair $(b_j, b_j')$, and $(x^s_k, y^s_k)$ denote coordinates of the center of the self-symmetry device module $b^s_k$. The symmetric placement of a symmetry group $S_i$ with 1D vertical or horizontal symmetry must satisfy the equations of Group (1) or Group (2) listed in Table II, while placement of a symmetry group with 2D symmetry must satisfy either the equations of Group (3) or the equations of Group (4).

TABLE II

| Group | | | |
|---|---|---|---|
| (1) | (2) | (3) | (4) |
| $2x^\wedge_i = x_j + x_j'$ | $x_j = x_j'$ | $2x^\wedge_i = x_j + x_j'$ | $x_j = x_j'$ |
| $y_j = y_j'$ | $2y^\wedge_i = y_j + y_j'$ | $y_j = y_j'$ | $2y^\wedge_i = y_j + y_j$ |
| $x^\wedge_i = x_k^s$ | $y^\wedge_i = x_k^s$ | $x^\wedge_i = x_k^s$ | $x^\wedge_i = x_k^s$ |
| | | $y^\wedge_i = x_k^s$ | $y^\wedge_i = x_k^s$ |

Figure 38:
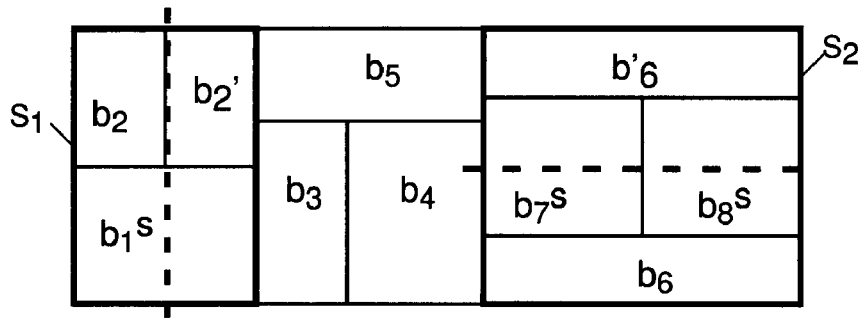
FIGS. 38-40 are simplified plan views of example placements.

FIG. 38 shows a symmetric placement example of ten device modules, including two symmetry groups $S_1$ and $S_2$, where $S_1=\{b^s_1, (b_2, b_2')\}$ in 1D vertical symmetry, and $S_2=\{(b_6, b_6'), b^s_7, b^s_8\}$ in 1D horizontal symmetry.

Figure 39:
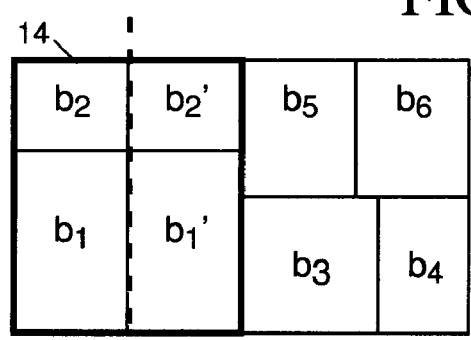
Figure 40:
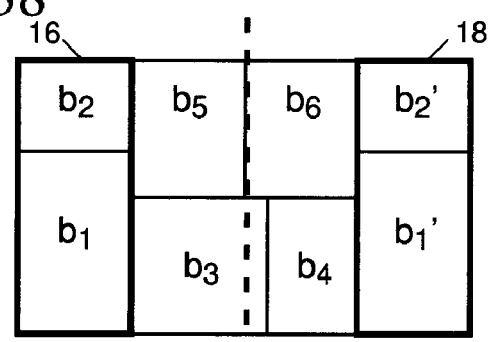

To reduce circuit sensitivities due to thermal gradients and process variations, device modules of the same symmetry group should be placed as close as possible to each other, and to help achieve this result, the invention employs the concept of a symmetry islands. A symmetry island is a placement of a symmetry group satisfying symmetry constraints on the symmetry group wherein each device module in the group abuts at least one other device module of the same group such that device modules in the symmetry group form a connected placement. FIGS. 39 and 40 show alternative placements for the same symmetry group $S=(b_1, b_1'), (b_2, b_2')$. The placement shown in FIG. 39 forms a symmetry island 14 in which device modules $b_1, b_1', b_2$ and $b_2'$ abut one another, but the placement in FIG. 40 does not form a symmetry island since it results in two disconnected components 16 and 18. The placement style in FIG. 39 is usually preferable in analog IC layout.

Proximity Constraints

Figure 9:
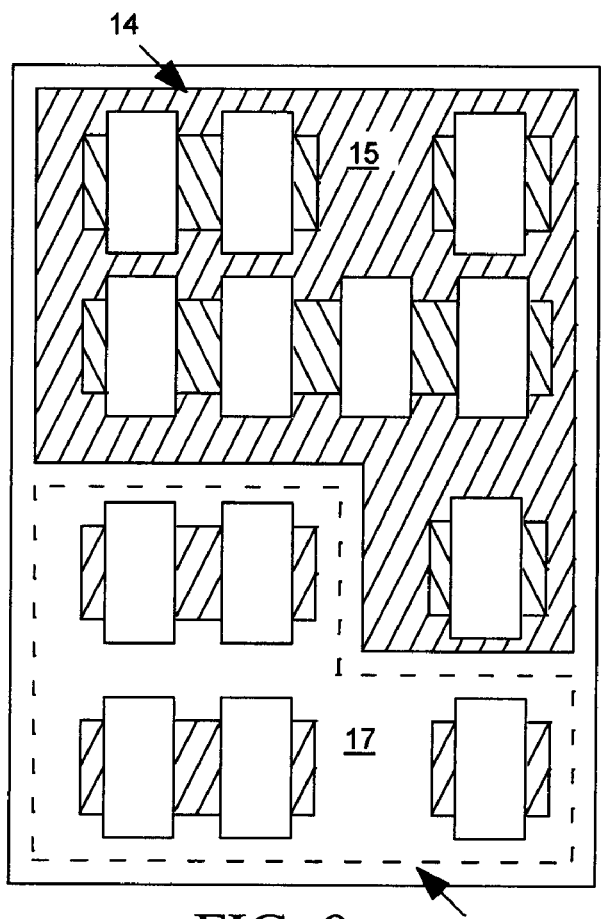
FIG. 9 is a simplified plan view of a prior art placement of a PMOS proximity and an NMOS proximity group

A "proximity constraint" limits a particular group of devices to a connected placement with the devices placed near one another, for example, so that they share a common substrate/well region, so that they are surrounded by a common guard ring, or so that they can be interconnected by short wire. A group of devices subject to a proximity constraint is called a "proximity group". For example, FIG. 9 illustrates a placement of a PMOS proximity group 14 sharing a common N-well 15 and an NMOS proximity group 16 formed in a p-substrate 17. Proximity groups may be hierarchical. For example, proximity groups 14 and 16 of FIG. 9 can be designated as a higher-level proximity group to ensure they are placed near one another when the two lower-level proximity groups must be interconnected by short wires.

Given a hierarchical proximity group Gi containing n device modules and m hierarchical proximity groups, the placement of Gi produced by the placement tool exhibits the following properties:

Property 1: The boundary between Gi and other device modules can be either straight or irregularly rectilinear.

Property 2: Each device module or lower level proximity groups forming Gi must be channel-adjacent to at least one of the other device modules or hierarchical group within Gi.

Figure 10:
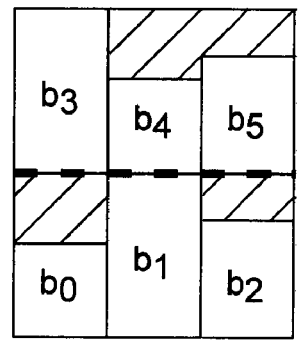
FIGS. 10 and 11 are simplified plan views of alternative prior art proximity group placements.
Figure 11:
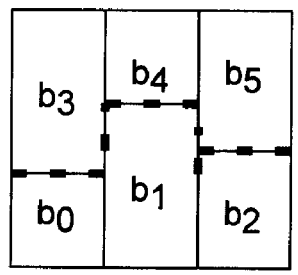

FIGS. 10 and 11 depict alternative placements for an IC consisting of six device modules b0-b5 wherein device module set {b0, b1, b2} forms an NMOS proximity group G1, and device module set {b3, b4, b5} forms a PMOS proximity group G2. When generating a placement for a proximity group, the placement tool may constrain device modules forming a proximity group to an area having a rectangular boundary containing no other device modules or may allow the device modules to reside within an area having an "irregularly rectilinear" boundary having edges that are straight lines in which all corners are right angles, but which need not necessarily be a rectangle. In the placement of FIG. 10, the boundary between groups G1 and G2 is straight because the placement tool is constrained to place proximity groups within rectangular areas. In the placement of FIG. 11, the boundary between groups G1 and G2 is not straight because the placement tool was able to place a proximity group within an irregularly rectilinear area. Since the area utilization in the placement of FIG. 11 is better than in the placement of FIG. 10, the placement tool preferably is capable of placing proximity groups in irregularly rectilinear areas.

FIGS. 67A and 67B show alternative placements for an IC having seven device modules b0-b6 forming two proximity groups G1={b0, b1, b2} and G2={b3, b4, b5}. In the placement of FIG. 67A device modules b4 and b5 are not channel-adjacent while in the placement of FIG. 67B, device modules b4 and b5 are channel-adjacent. The placement tool generates placements providing channel adjacency between device modules and proximity groups in the same hierarchical proximity group.

B*-trees

Figure 12:
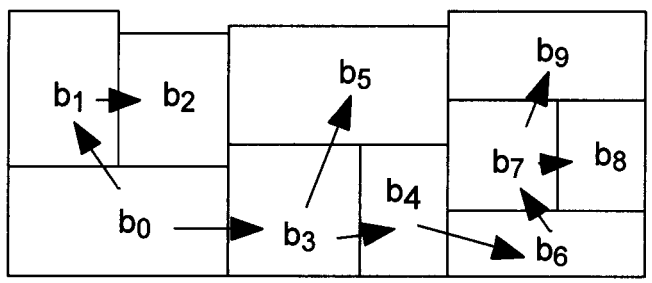
FIG. 12 is a simplified plan view of a prior art compacted placement of a set of device modules $b_0$-$b_9$.
Figure 13:
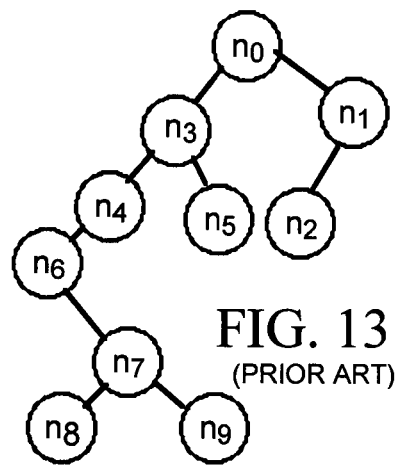
FIG. 13 depicts a prior art B*-tree representation of the placement of FIG. 12.

A B*-tree can represent a compacted placement of device modules in which no device module can move any further down or to the left. FIG. 12 shows a compacted placement of a set of 10 device modules $b_0$-$b_9$ and FIG. 13 shows a corresponding B*-tree representation of that placement wherein every node $n_i$ of the B*-tree corresponds to a device module $b_i$ of the compacted placement. The root $n_0$ of the B*-tree of FIG. 13 corresponds to the device module $b_0$ on the bottom-left corner of the placement of FIG. 12. For each node $n_i$ corresponding to a device module $b_i$, the left child of node $n_i$ represents the lowest, adjacent device module on the right side of device module $b_i$, while the right child of node $n_i$ represents the first device module above $b_i$ having the same horizontal coordinate.

Given a B*-tree representation of a compacted placement, the placement tool can calculate the coordinates $(x_i, y_i)$ of each device module in the plane of the placement area by a pre-ordered tree traversal. Suppose the device module $b_i$, represented by the node $n_i$, has the bottom-left coordinate $(x_i, y_i)$, width $w_i$, and height $h_i$. Then for the left child, $n_j$, of $n_i$, $x_j = x_i + w_i$; for the right child, $n_k$, of $n_i$, $x_k = x_i$. A placement tool in accordance with the invention maintains a contour structure to calculate y-coordinates. Thus, starting from the root node, whose bottom-left coordinate is (0, 0), then visiting the root's left subtree, and then its right subtree, the tool can use a pre-order tree traversal procedure (B*-tree packing) to calculate all coordinates of the device modules in the placement. A B*-tree is a convenient way for a placement tool to represent a compacted placement and allows a placement tool to quickly modify a placement by modifying its B*-tree representation and to quickly evaluate various aspects of a placement by processing its B*-tree representation.

ASF-B*-trees

A placement tool in accordance with the invention employs an improved form of a B*-tree, hereinafter called an automatically symmetric-feasible B*-tree ("ASF-B*-tree") to represent a layout for a symmetry island. A conventional B*-tree representation of a placement includes a separate node $n_i$, $n_i'$ or $n_i^s$ representing each device module $b_i$, $b_i'$ or $b_i^s$ of an IC. An ASF-B*-tree representation of a symmetry island includes only "representative nodes" $n_i^r$ corresponding to "representative device modules" $b_i^r$ of the IC. In order to construct an ASF-B*-tree representation of a symmetry island, it is necessary for the placement tool to first establish a representative device module for each symmetry group or self-symmetry device module that is subject to a symmetry constraint and for each "symmetrically unconstrained" device module that is not subject to a symmetry constraint.

Definition 1. The representative device module $b_j^r$ for a symmetry pair $(b_j, b_j')$ in a 1D symmetric placement is $b_j'$ and is the upper half of $b_j'$ in a 2D placement.

Definition 2. The representative device module $b_k^r$ of a self-symmetry device module $b_k^s$ is the right half of $b_k^r$ in a 1D symmetric placement or the top-right quarter of $b_k^r$ in a 2D symmetric placement.

Figure 14:
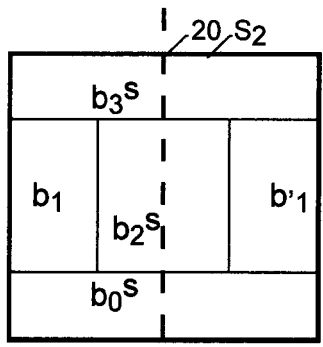
FIG. 14 is a simplified plan view of a 1D symmetric placement for a symmetry island that is symmetric about a vertical axis.
Figure 15:
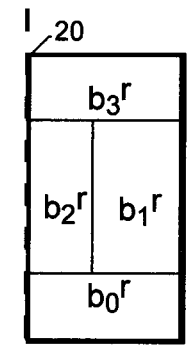
FIG. 15 is a simplified plan view of a placement for only representative device modules for a symmetry group of FIG. 14.
Figure 16:
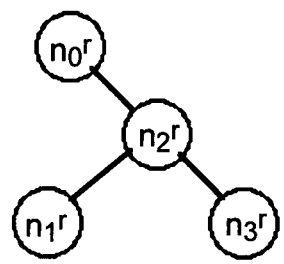
FIG. 16 depicts an ASF-B* tree representation of the placement of FIG. 15.

FIG. 14 shows a 1D symmetric placement for a symmetry island $S_2$ that is symmetric about a vertical axis 20, FIG. 15 shows a corresponding placement for only the representative device modules for the symmetry group of FIG. 14, and FIG. 16 shows a corresponding ASF-B* tree representation of the placement of FIG. 14. The symmetry axis of a symmetry group in a 1D symmetric placement can be either vertical or horizontal. In FIG. 14, the device modules in the symmetry island $S_2 = \{(b_1, b'_1), b^s_0, b^s_2, b^s_3\}$ are placed symmetrically with respect to its vertical axis 20. To construct the corresponding ASF-B*-tree, the placement tool selects the representative device module of each symmetry pair and self-symmetry device module and considers the placement on the right-half plane. FIG. 15 shows the representative device modules, and FIG. 16 shows ASF-B*-tree corresponding to the symmetric placement wherein each node in the ASF-B*-tree corresponds to a representative device module.

Figure 17:
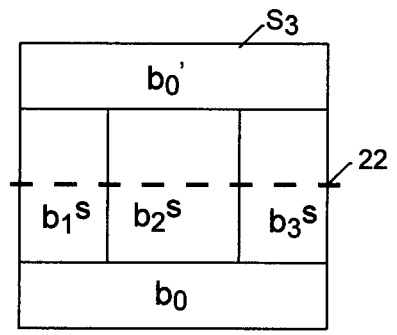
FIG. 17 is a simplified plan view of a 1D symmetric placement for a symmetry group that is symmetric about a horizontal axis.
Figure 18:
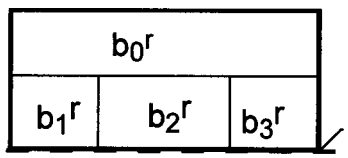
FIG. 18 is a simplified plan view of a corresponding placement for representative device modules for the symmetry group of FIG. 17
Figure 19:
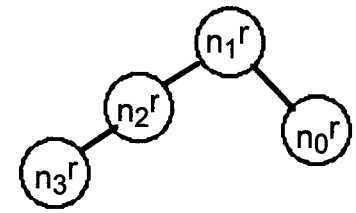
FIG. 19 depicts an ASF-B* tree representation of the placement of FIG. 18.
Figure 20:
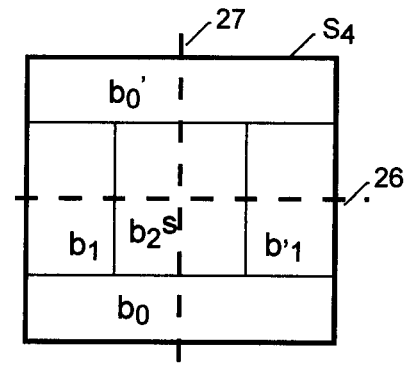
FIG. 20 is a simplified plan view of a placement for a 2D symmetry group
Figure 21:
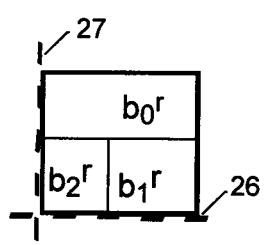
FIG. 21 is a simplified plan view of a placement for representative device modules for the symmetry group of FIG. 20.

FIG. 17 shows a 1D symmetric placement for a symmetry group $S_3$ that is symmetric about a horizontal axis 22, FIG. 18 shows a corresponding placement for only the representative device modules for the symmetry group of FIG. 17, and FIG. 19 shows a corresponding ASF-B* tree representation of the placement of FIG. 17. FIG. 20 shows a 2D symmetric placement for a symmetry group $S_4$ that is symmetric about horizontal and vertical axes 26 and 27, FIG. 21 shows a corresponding placement for only the representative device modules for the symmetry group of FIG. 20.

Since each symmetry pair or self-symmetry device module has its own representative device module, the number of the nodes in an ASF-B* tree representation of a symmetry island should be the same as the number of symmetry pairs and self-symmetry device modules in the symmetry island. Once a placement tool has generated an ASF-B*-tree for a packed symmetry island, it can obtain the coordinates of their symmetric device modules based on the given coordinates of the symmetry axes. The device module coordinates then act as guides for placement of a symmetry island.

In a 1D symmetric placement, the representative of a self-symmetry device module abuts the symmetry axis. Let S be a symmetry group with 1D vertical symmetric placement, and $b^s$ be a self-symmetry device module in S. The symmetry axis of S is denoted by $\hat{x}$, and the center of $b^s$ is denoted by $(x_s, y_s)$. In 1D vertical symmetry, the symmetry axis $\hat{x}$ always passes through the center $(x_s, y_s)$ of the self-symmetry device module $b_s$, i.e. $\hat{x}=x_s$. According to Definition 2 above, the representative $b^r$ of $b^s$ is the right half of $b^s$. Therefore, the center $(x_s, y^s)$ of $b^s$ must be on the left boundary of $b^r$. To keep the symmetric-feasible condition $\hat{x}=x^s$, $b_r$ must abut the symmetry axis $\hat{x}$. The case for 1D horizontal symmetry can be proved similarly.

In a 1D symmetric placement, the representative of a symmetry pair is always symmetric-feasible. Let S be a symmetry group with 1D vertical symmetric placement, and (b, b') be a symmetry pair in S. The symmetry-axis of S is denoted by $\hat{x}$, and the centers of b and b' are (x, y) and (x', y'). The representative of the symmetry pair (b, b') is b'. In 1D vertical symmetry, given the coordinate of the representative b' and the symmetry axis $\hat{x}$, the coordinate of the symmetric device module can be calculated by the equations $2\hat{x}=x+x'$ and $y=y'$. Therefore, the symmetric-feasible condition is always satisfied. The case for 1D horizontal symmetry is similarly shown.

The left-boundary (or right-boundary) constraint for 1D vertical (or horizontal) symmetric placement: the representative node of a self-symmetry device module should always be on the right-most (or left-most) branch of the ASF-B*-tree. The nodes representing the device modules on the left boundary should be on the rightmost branch as shown in FIG. 16. Similarly, we can derive the ASF-B*-tree of the symmetric placement when the symmetry axis is in the horizontal direction. In this case, the placement tool need only consider the top-half plane during the placement of the representative device modules. FIG. 19 shows the ASF-B*-tree of the symmetry island $S_3=\{(b_0, b_0'), b_1^s, b_2^s, b_3^s\}$ having symmetric placement with respect to the horizontal symmetry axis 22 in FIG. 17. Again, the representatives of the self-symmetry device modules should abut the horizontal symmetry axis, which is on the bottom boundary of the top-half plane. Therefore, the nodes representing the device modules on the bottom boundary should be on the leftmost branch, as illustrated FIG. 19

Figure 22:
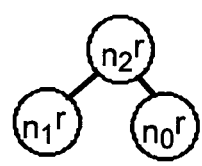
FIG. 22 is an ASF-B* tree representation of the placement of FIG. 21.

The placement tool also represents the 2D symmetric placement of a symmetry island using the ASF-B*-tree. FIG. 20 shows the 2D symmetric placement of the symmetry group $S=\{(b_0, b_0'), (b_1, b_1'), b_2^s\}$, where device modules $b_0$ and $b_0'$ are placed symmetrically along the horizontal symmetry axis 26, device modules $b_1$ and $b_1'$ are placed symmetrically along the vertical symmetry axis 27, and device module $b_2$ is self-symmetric on both axes. For the 2D symmetric placement, the placement tool need only consider the top right quarter of the plane and select a representative device module for each symmetry pair and self-symmetry device module, as shown in FIG. 21. FIG. 22 shows the corresponding ASF-B*-tree.

In a 2D symmetric placement, the representative of a self-symmetry device module must abut both symmetry axes. Let S be a symmetry group with 2D symmetric placement, and $b^s$ be a self-symmetry device module in S. The symmetry axes of S is denoted by $\hat{x}$ and $\hat{y}$, and the center of $b^s$ is denoted by $(x^s, y^s)$. In 2D symmetry, both symmetry axes $\hat{x}$ and $\hat{y}$ must pass through the center $(x^s, y^s)$ of the self-symmetry device module $b^s$, i.e. $\hat{x}=x^s$ and $\hat{y}=y^s$. According to Definition 2, the representative $b^r$ of $b^s$ is the top-right quarter of $b^s$. Therefore, the center $(x^s, y^s)$ of $b^s$ will be located on the bottom-left corner of $b^r$. To keep the symmetric-feasible condition $\hat{x}=x^s$ and $\hat{y}=y^s$, $b^r$ must about both symmetry axes $\hat{x}$ and $\hat{y}$.

In a 2D symmetric placement, there is at most one self-symmetry device module. The representative node of the self-symmetry device module is the root node of the ASF-B*-tree. Both symmetry axes must pass through the center of the self-symmetry device module, and since the device modules cannot be overlapped, there is at most one self-symmetry device module whose center is right on the symmetry axes. In a 2D symmetric placement, the representative of a symmetry pair must abut one of the symmetry axes. Let S be a symmetry group with 2D symmetric placement, and (b, b') be a symmetry pair in S. The symmetry axes of S are denoted by $\hat{x}$ and $\hat{y}$, and the centers of b and b are denoted by (x, y) and (x', y'), respectively. In 2D symmetry, there is exactly one of the symmetry axes $\hat{x}$ and $\hat{y}$ passing through the centers (x, y) and (x', y') of the symmetry pair (b, b'), i.e. $\hat{x}=x=x$ or $\hat{y}=y=y'$. We first consider the case $\hat{x}=x=x'$. According to Definition 2, the representative $b^r$ of (b, b') is the right half of b'. Therefore, the center (x', y') of b' must be on the left boundary of $b^r$. To keep the symmetric-feasible condition $\hat{x}=x'$, $b^r$ must abut the symmetry axes x. The proof of $\hat{y}=y=y'$ is similar.

There are three kinds of the boundary constraints for a 2D symmetric placement:

1) Left-boundary constraint: For the symmetry pair $(b_0, b_0')$ whose centers $(x_0, y_0)$ and $(x'_0, y'_0)$ lie on the vertical symmetry axis, the representative node $b_0^r$ is on the right-most branch of the ASF-B*-tree.

2) Bottom-boundary constraint: For the symmetry pair $(b_1, b_1')$ whose centers $(x_1, y_1)$ and $(x_1', y_1')$ lie on the horizontal symmetry axis, the representative node $b^r_1$ is on the left-most branch of the ASF-B*-tree.

3) Corner constraint: For the self-symmetry device module $b_2^s$ whose center $(x_2, y_2)$ lie on both symmetry axes, the representative node is the root node of the ASF-B*-tree.

As shown in FIG. 20, the representative $b_0^r$ of the symmetry pair $(b_0, b_0')$ abuts the vertical symmetry axis at the left boundary, and thus the corresponding node $n_0^r$ is on the rightmost branch of the ASF-B*-tree. Also, the representative $b_1^r$ of the symmetry pair $(b_1, b_1')$ abuts the horizontal symmetry axis at the bottom boundary, and thus the corresponding node $n^r_1$ is on the leftmost branch of the ASF-B*-tree. The representative $b^r_2$ of the self-symmetry device module $b_2^s$ abuts both symmetry axes at the corner, and thus the corresponding node $n_2^r$ is the root of the ASF-B*-tree.

An ASF-B*-tree is symmetric-feasible in both 1D and 2D symmetric placements since all the representatives in the ASF-B*-tree are symmetric-feasible. There are four kinds of representatives, and the symmetric-feasible condition for each is proven above. Therefore, an ASF-B*-tree is symmetric-feasible in both 1D and 2D symmetric placements.

All representative device modules of a symmetry group will form a connected placement (a symmetry island) after packing. The placement tool sets the coordinate(s) of the symmetry axis (axes) to the left or (and) the bottom boundary (boundaries) of the connected placement of the representative device modules. The symmetric device modules also form a connected placement, and the boundary of the connected placement also abuts the symmetry axis (axes). Therefore, the entire symmetry group forms a connected placement, and each device module in the group abuts at least one of the other device modules in the same group. The packing of an ASF-B*-tree thus results in a symmetry island of the corresponding symmetry group.

After obtaining the placement of the representative device modules, the placement tool creates a mirrored placement of the symmetric ones that are also unique. Therefore, there is a unique correspondence between an admissible placement for a symmetry island and its ASF-B*-tree. A placement tool more efficiently finds a correct symmetric placement for a symmetry island represented by an ASF-B*-tree because it can avoid searching redundant solution spaces.

Hierarchical B*-Tree (HB*-Tree)

A placement tool in accordance with the invention uses a hierarchical B*-tree ("HB*-tree") to simultaneously place device modules in symmetry islands and non-symmetry device modules. In an HB*-tree, the symmetry island of each symmetry group can be in any rectilinear shape, and symmetry and non-symmetry device modules are simultaneously placed to optimize the placement.

Figure 23:
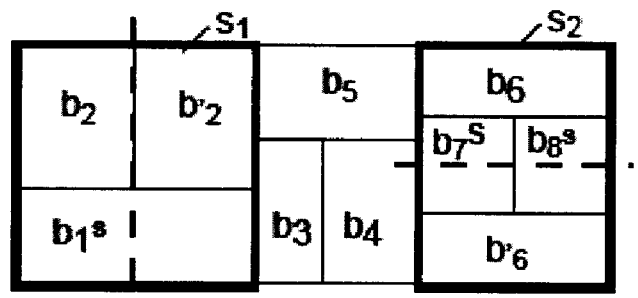
FIG. 23 is a simplified plan view of a placement including two symmetry islands and three other device modules.
Figure 24:
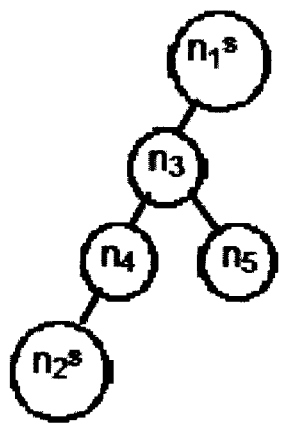
FIGS. 24-26 depict HB*-tree representations of the placement in FIG. 23.
Figure 25:
Figure 26:
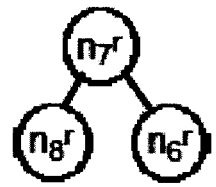

FIG. 23 illustrates a placement including two symmetry islands $S_1$ and $S_2$ along with three other device modules $b_3$, $b_4$, $b_5$. FIG. 24 illustrates an HB*-tree for the placement in FIG. 23 wherein each of two hierarchical nodes, $n_1^s$ and $n_2^s$ represent separate ASF-B*-trees as illustrated in FIG. 25 and FIG. 26 that in turn represent symmetry islands $S_1$ and $S_2$ of FIG. 23. FIG. 24 shows the HB*-tree representing the placement of FIG. 23. FIG. 25 shows the AFS-B*-tree corresponding to hierarchical node $n_2^s$ of FIG. 24 and representing the placement of symmetry island $S_1$ of FIG. 23, and FIG. 26 shows the AFS-B*-tree corresponding to hierarchical node $n_2^s$ of FIG. 24 and representing the placement of symmetry island $S_2$ of FIG. 23. Nodes node $n_1^s$ and $n_2^s$ are "hierarchical" in the sense that each represents a lower order AFS-B*-tree.

Figure 27:
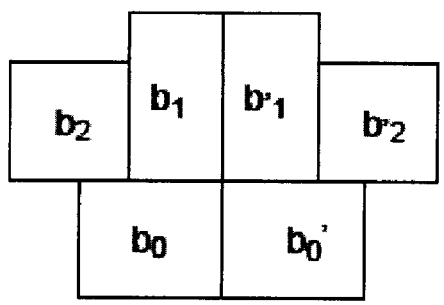
FIG. 27 is a simplified plan view of a symmetry island placement.
Figure 28:
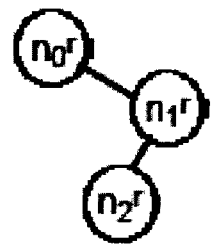
FIG. 28 depicts an AFS-B*-tree representation of the placement of FIG. 27.
Figure 29:
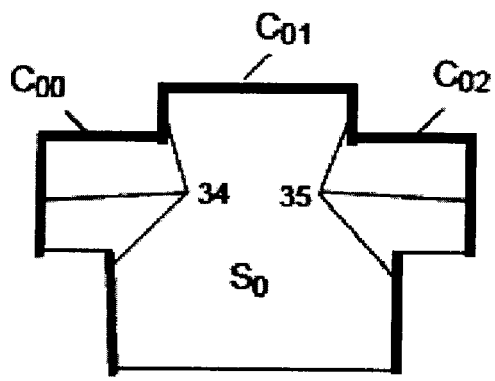
FIG. 29 is a simplified plan view of the symmetry island placement of FIG. 27 defining edges that may be represented by a set of contour nodes in an AFS-B*-tree representation of the placement.
Figure 30:
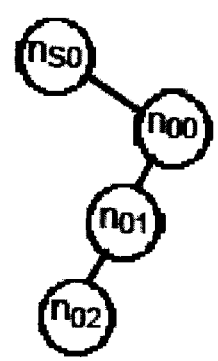
FIG. 30 depicts an augmented AFS-B*-tree representation of the placement of FIG. 27.

Although symmetry islands are always rectilinear in shape they are often non-rectangular as, for example, is the case for symmetry island of FIG. 27. Since a non-rectangular symmetry island has more than four sides, it is necessary for the placement tool to augment an HB*-tree representing a non-rectangular symmetry island in order to use it to define the relative positions of all device modules. FIG. 28 shows an AFS-B*-tree for the placement of symmetric device modules forming the symmetry island $S_0$ of FIG. 27. FIG. 30 shows an augmented HB*-tree representation of $S_0$, which includes a hierarchical node $n_0^s$ representing the ASF-B*-tree of FIG. 28 as well as three "contour nodes" $n_{00}$, $n_{01}$, and $n_{02}$ representing the symmetry island's three top horizontal contour segments $C_{00}$, $C_{01}$, and $C_{02}$ of symmetry island $S_0$ as illustrated in FIG. 29. Each contour node retains the coordinates of the corresponding horizontal contour segment.

An HB*-tree has the following properties:

1) The left child of a hierarchy node, if any, must be a non-contour node.

2) The right child of a hierarchy node must be the contour node representing the left-most horizontal contour segment of the symmetry island.

3) The left child of a contour node, if any, must be the contour node representing the next contour segment on the right side.

4) The right child of a contour node, if any, must be a non-contour node.

5) The children of a regular device module node must be non-contour nodes.

6) The parent of a contour node cannot be a regular device module node.

7) The parent of a regular device module or a hierarchy node can be any other node.

HB*-tree Packing

Before packing an HB*-tree, the placement tool packs the ASF-B*-tree for each hierarchical node representing a symmetry island to obtain the outline of the symmetry island. The placement tool then stores data indicating the symmetry island's vertical and horizontal contours in the corresponding hierarchy node. While packing a hierarchical node representing a symmetry island, the placement tool calculates the best packing coordinate for the bottom boundary of the symmetry island, based on the effective two (dual) vertical contours 34 and 35 shown in FIG. 29. After packing the left child of the hierarchy node and all its descendants are packed, the placement tool packs the first contour node of the symmetry island, followed by the second one, and so on. When packing the contour nodes, the placement tool need only update their coordinates and replace the hierarchy node in the contour data structure of the HB*-tree.

Figure 31:
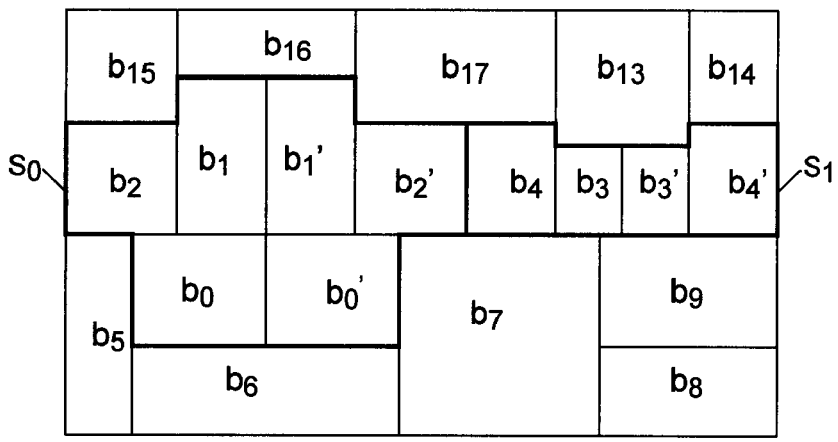
FIGS. 31 and 32 are simplified plan views of a placement for a set of device modules including two non-rectangular symmetry islands.
Figure 32:
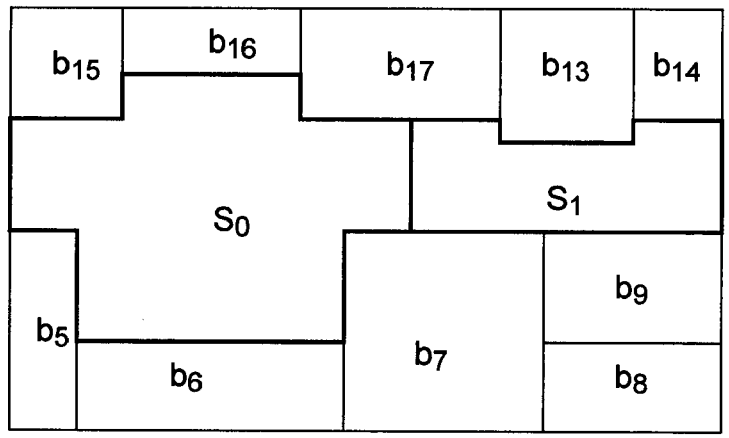
Figures 33, 34, 35:
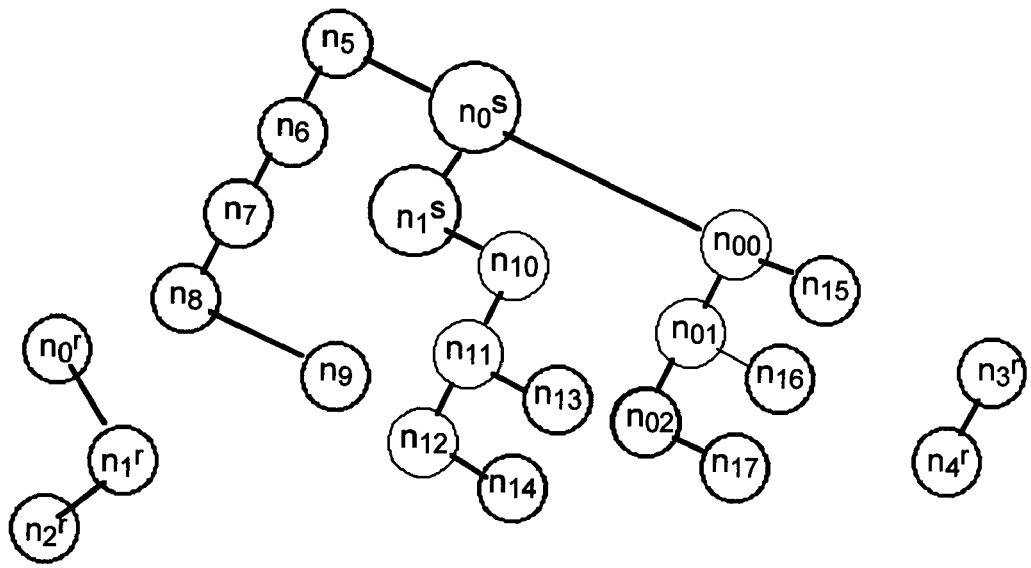
FIG. 34 depicts an HB*-tree representation of the placement of FIG. 32.
FIGS. 33 and 35 are ASF*-B-trees representations of the symmetry islands of FIG. 31.

FIGS. 31 and 32 depict a placement for a set of device modules including two non-rectangular symmetry islands $S_0$ and $S_1$. The placement tool first packs the two ASF-B*-trees in $n_0^s$ and $n_1^s$ and obtains the outlines of the two rectilinear symmetry islands. The placement tool then packs nodes, $n_5$, $n_6$, $n_7$, $n_8$, $n_9$ to obtain a temporal contour list $<n_5, n_6, n_7, n_9>$. By calculating rectilinear outlines between the temporal contour list and the bottom boundary of the symmetry island $S_0$, the placement tool minimizes dead space between the previously packed device modules and the symmetry island to obtain an updated temporal contour list $<n_0^s, n_7, n_9>$. Continuing the packing procedure, the placement tool obtains the resulting placement. FIG. 34 illustrates the corresponding HB*-tree, with nodes $n_0^s$ and $n_1^s$ corresponding to symmetry islands $S_0$ and $S_1$ represented by the ASF*-B-trees of FIGS. 33 and 35, respectively.

Hierarchical Device Module Clustering

Figure 36:
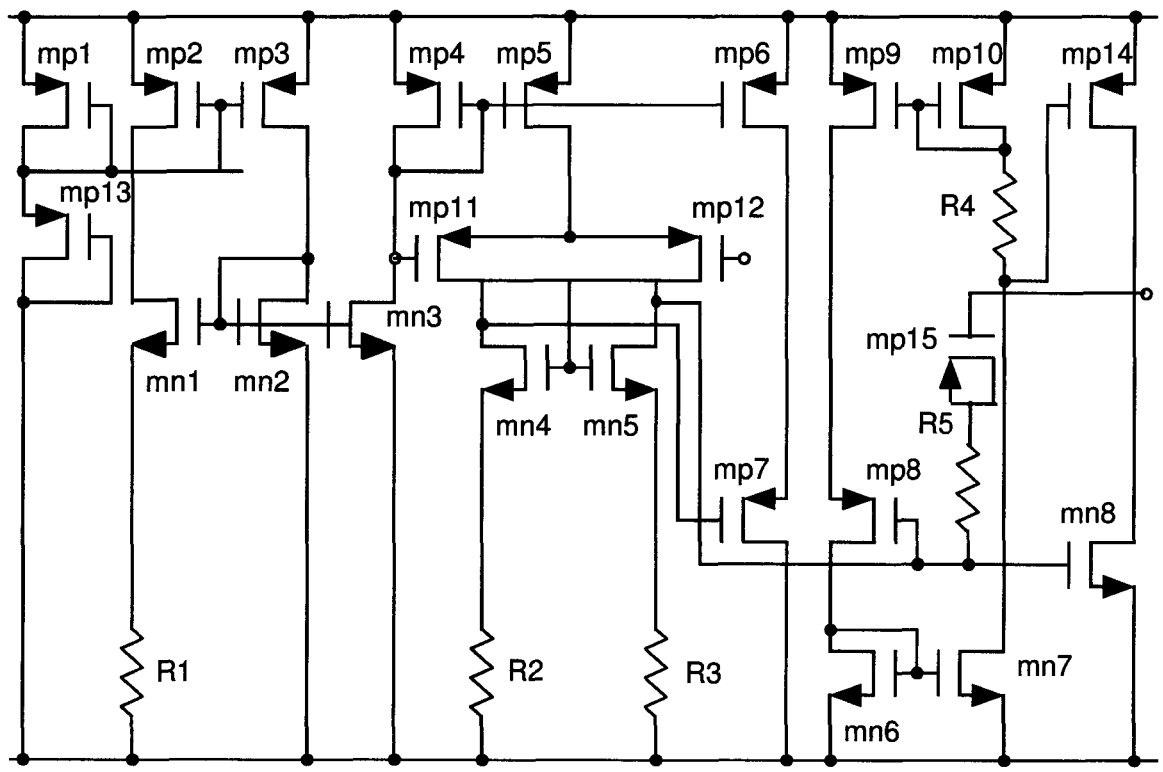
FIG. 36 is a schematic diagram of a two-stage operational amplifier.

FIG. 36 is a schematic diagram of an example two-stage operational amplifier formed by fifteen PMOS transistors mp1-mp15, eight NMOS transistors m1-m8, and five resistors R1-R5. Before generating the layout, the placement tool processes the IC design to define a multiple-level hierarchy of groups, wherein each group consists of elements that are subject to one of the matching, symmetry or proximity placement constraints, and wherein each element of each group at each level of the hierarchy consists of either of one of the device modules or another one of the groups residing at a lower level of the hierarchy.

Figure 37:
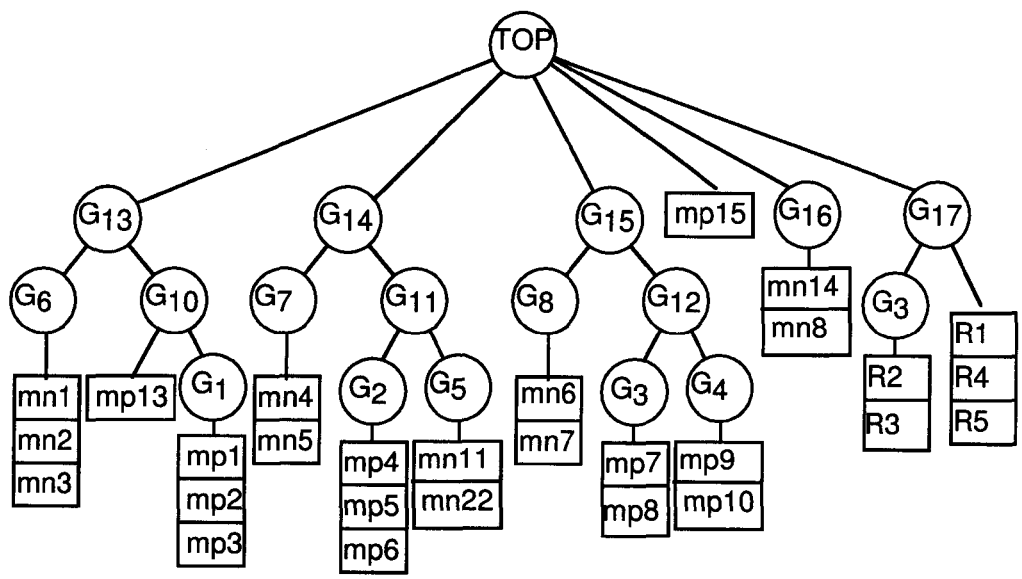
FIG. 37 depicts a hierarchical grouping of device modules of the amplifier of FIG. 36.

FIG. 37 depicts an example hierarchical grouping of the device modules that the placement tool could establish for the amplifier of FIG. 36. In this example, the placement tool initially identifies the following nine low-level matching groups, each consisting of two or more device modules:

G1={mp1, mp2, mp3},
G2={mp4, mp5, mp6},
G3={mp7, mp8},
G4={mp9, mp11},
G5={mp11, mp12},
G6={m1, m2, m3},
G7={m4, m5},
G8={m6, m7}, and
G9={R2, R3}.

After identifying the matching groups, the placement tool identifies any hierarchical symmetry and hierarchical proximity groups according to the device types and the functionality of the sub-circuits that form them. In general, the tool creates hierarchical symmetry groups for differential circuit devices and creates hierarchical proximity groups for other sub-circuit devices. Device types include PMOS transistors, NMOS transistors, resistors, and capacitors. Sub-circuit types include bias circuits, differential input stages, gain stages, and output stages. When creating symmetry and proximity groups for each sub-circuit, the placement tool separately considers active devices such as transistors and passive devices such as resistors and capacitors. The placement tool initially defines hierarchical symmetry and proximity groups in each sub-circuit based on the transistor device types (PMOS or NMOS) and then creates additional higher-level proximity groups based on device types. For the example of circuit of FIG. 36, the placement tool created the following hierarchical groups for the hierarchy of FIG. 37:

a hierarchical proximity group G10={G1, mp13} for PMOS transistors in the bias circuitry, a hierarchical symmetry group G11={G2, G5} for PMOS transistors in the differential input stage, a hierarchical proximity group G12={G3, G4} for PMOS transistors in the gain stage, a hierarchical proximity group G13={G6, G10} for all transistors in bias circuitry, a hierarchical symmetry group G14={G7, G11} for all transistors in the differential input stage, a hierarchical proximity group G15={G8, G12} for all transistors in the gain stage, a hierarchical proximity group G16={mp14, m8} for all transistors in the output stage, a hierarchical proximity group G17={R1, G9, R4, R5}.

Note that although transistor mp15 of FIG. 36 is a PMOS transistor, it behaves like a capacitor because its source and drain are connected as a short circuit. Since there is no other capacitor in the circuit, the placement tool did not incorporate it into any constraint group.

Hierarchical Framework

After defining the group hierarchy, the placement tool generates a hierarchal representation of a trial placement for the IC comprising a separate group representation for each group of the hierarchy and a separate device representation for each of the device modules not included in any of the groups. Each group representation defines relative positions within the IC of the elements of the group that are consistent with the placement constraint on the elements of the group and each device representation defines a relative position of the device module it represents. In the preferred embodiment of the invention the placement tool uses a hierarchical B*-tree (HB*-tree) to represent an IC placement wherein each constraint group and each device module not forming any constraint group is represented by a separate node of the HB*-tree. The placement tool employs a simulated annealing technique to iteratively and hierarchically perturb the HB*-tree representation to produce a sequence of trial placements, uses a cost function to evaluate the quality of each trial placement and then selects the best trial placement as the final placement.

Figure 41:
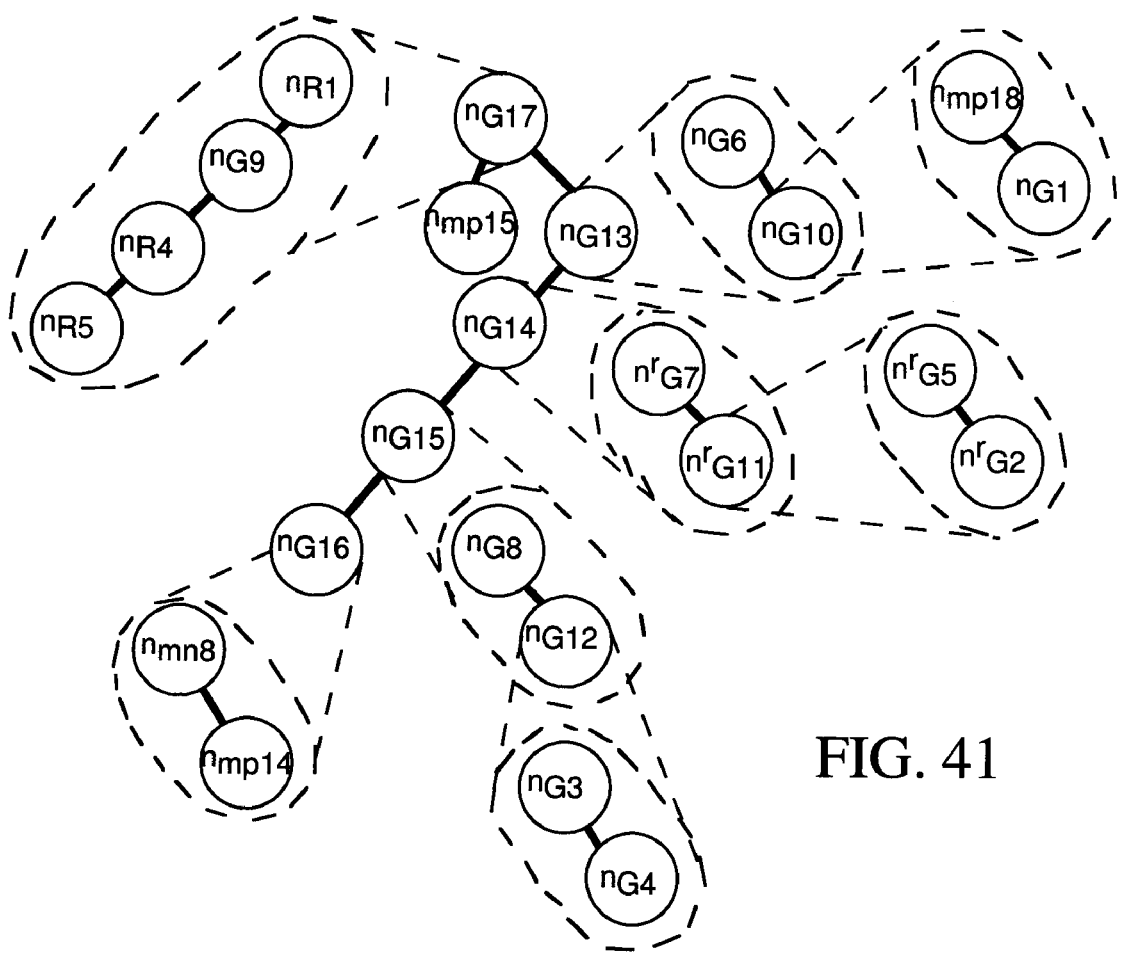
FIG. 41 depicts an HB*-tree representation of a placement for the operational amplifier of FIG. 36.

A placement tool in accordance with the invention extends the hierarchical framework from one-level symmetry constraints to more general hierarchical analog placement constraints including matching, hierarchical symmetry and hierarchical proximity. Given an analog design with complex hierarchical constraints, such as for example the operational amplifier depicted in FIG. 36, the placement tool first constructs a corresponding HB*-tree as shown in FIG. 41. An HB*-tree can include device module nodes, matching group nodes, symmetry group nodes, proximity group nodes and contour nodes. Contour nodes can be ignored to simplify the tree structure. The HB*-tree of FIG. 41 comprises one device module node nmp15 and five hierarchy nodes including a symmetry group node nG14 and four proximity group nodes, nG13, nG15, nG16, and nG17. Node nG14 represents the hierarchical symmetry group G14, while nodes nG13, nG15, nG16, and nG17 represent corresponding hierarchical proximity groups.

Device Matching Nodes

The HB*-tree can be extended to also represent matching device placement because the hierarchical framework can easily integrate with other approaches such as the pattern based approaches described by U.S. Patent Application Publication No. 20080092099 "Analog and mixed-signal IC layout system," dated Apr. 17, 2008, and "A matching-based placement and routing system for analog design," appeared in Proc. VLSI-DAT, pp. 16-19, 2007 by Lin et al; or grid-based approaches: "Analog placement with common centroid constraints," appeared in Proc. ICCAD, pp. 579-585, 2007 by Ma et al for better considering the special placement requirements of matching devices. The above mentioned documents are incorporated herein by reference. After the placement tool generates a placement for matching group G1 it constructs matching group node nG1 to represent the corresponding rectangular outlines of the matching group G1. The placement tool constructs nodes nG2-nG8 in a similar manner.

Device Symmetry Nodes

The placement tool includes hierarchy nodes in ASF-B*-trees to handle hierarchical symmetry constraints. For example, the ASF-B*-tree in nG14 consists of n$^r$G7 and n$^r$G11, where n$^r$G7 corresponds to the representative of the matching group G7 and n$^r$G11 denotes the representative of the symmetry group G11. Node nG11 further contains another ASF-B*-tree consisting of nodes n$^r$G2 and n$^r$G5 representing matching groups G2 and G5 respectively.

Proximity Nodes

In each proximity group node, there is also an HB*-tree representing the placement of device modules and/or other device groups. For example, the HB*-tree in the nG13 consists of nG6 and nG10. nG10 further contains another HB*-tree consisting of nmp18 and nG1.

Hierarchical Packing

When packing the HB*-tree in FIG. 41, the placement tool first traverses all matching group nodes to generate the corresponding matching placement of the devices in each matching group. The placement tool can generate the matching placement based, for example, on the pattern based approach described by U.S. Patent Application Publication No. 20080092099 "Analog and mixed-signal IC layout system," dated Apr. 17, 2008, and by the article "A matching-based placement and routing system for analog design," appeared in Proc. VLSI-DAT, pp. 16-19, 2007 by Lin et al; or on a grid-based approach described in the article "Analog placement with common centroid constraints," appeared in Proc. ICCAD, pp. 579-585, 2007 by Ma et al. The above-mentioned documents are incorporated herein by reference.

The placement tool then traverses the symmetry group nodes hierarchically to generate corresponding hierarchical symmetry islands. For the circuit of FIG. 36, the placement tool generates a symmetry island for symmetry group G11 before generating a symmetry island of the symmetry group G14 because G11 resides within G14. Once the placement tool establishes both symmetry islands, the symmetry group nodes nG11 and nG14 represent their outlines respectively.

Finally, the placement tool packs the top-level HB*-tree and other HB*-trees into the hierarchical proximity group nodes. When not permitting irregularly rectilinear boundary, the placement tool simply traverses the proximity group nodes hierarchically and generates a rectangular outline for each proximity group from the bottom to the top. In FIG. 41, the placement tool first packs the B*-trees in nodes nG10 and nG12 to generate placements for the corresponding proximity groups G10 and G12. The placement tool then continues to generate placements for all other proximity groups G13, G15, G16, and G17 accordingly, thereby obtaining an overall placement after packing the top-level HB*-tree.

FIG. 42 illustrates an example placement for top-level device module groups {G13-G17} of FIG. 41. FIG. 43 illustrates a corresponding placement showing boundaries of intermediate-level device module groups {G10-G12} in 41, and FIG. 44 illustrates a placement showing the boundaries of the bottom-level device module groups {G1-G9} in FIG. 41. After the placement tool generates matching placements for the matching groups G1-G8 in FIG. 44, the matching group nodes nG1-nG8 represent the corresponding rectangular outlines.

Although limiting proximity groups to rectangular outlines can produce acceptable placement results, permitting proximity groups to have irregularly rectilinear boundaries improves area utilization. Packing methodologies to cope with horizontal and vertical rectilinear boundary when packing an HB*-tree are discussed below. The boundary between two hierarchical proximity groups Gi and Gj is horizontal if the proximity group node of Gi is the right child of the corresponding proximity group node of Gj in HB*-trees. In FIG. 45, there are two proximity groups G0={b0, b1, b2} and G1={b3, b4, b5, b6, b7}.

Horizontal Irregularly Rectilinear Boundary

FIGS. 45-48 illustrate HB*-tree packing relative to a placement a horizontal irregularly rectilinear boundary. FIG. 45 shown an HB*-tree representing placement of two proximity groups G0={b0, b1, b2} and G1={b3, b4, b5, b6, b7}. FIG. 46 shows the resulting placement after packing the B*-tree in nG0. FIG. 47 Illustrate the resulting placement after packing the B*-tree in nG1. FIG. 48 illustrates a resulting proximity placement after introducing two "dummy nodes" D3 and D6. In the HB*-tree of FIG. 45, proximity group node nG1 is the right child of the first contour node, n00, of the proximity group node nG0. When packing the HB*-tree to allow a horizontal irregularly rectilinear boundary between G0 and G1, the placement tool first packs the B*-tree in the root node nG0 to obtain the placement shown in 46 having three horizontal contour segments. In the mean time, the corresponding contour nodes of proximity group node nG0 and other children of the contour nodes are dynamically updated.

The placement tool then considers proximity group node nG1, packing the B*-tree representing the placement of the proximity group G1. In a B*-tree, the nodes in a right-skewed sub-tree can guarantee the feasibility of the proximity constraint. To consider the case when some nodes are not in a right-skewed sub-tree, the placement tool maintains a disjoint-set data structure to keep track of whether the device modules in the same proximity group are channel-adjacent during packing. For example, device module b5 of FIG. 47 is not channel adjacent to other device modules in G1. The placement tool maintains three disjoint sets {b3, b4}, {b5}, and {b6, b7}. Since device modules represented by the nodes in a left-skewed sub-tree are channel-adjacent if and only if there is a bus passing through the alignment range of the device modules, the channel adjacency placement problem is reduced to a horizontal bus-driven floor-planning problem. Therefore, the placement tool can apply a method taught in the article: "Modern floor-planning based on B*-trees and fast simulated annealing," IEEE TCAD, vol. 25, no. 4, pp. 637-650, April 2006 by Chen and Chang, incorporated herein by reference. The method described by Chen and Chang handles the bus constraint by introducing dummy nodes.

Vertical Irregularly Rectilinear Boundaries

Figure 49:
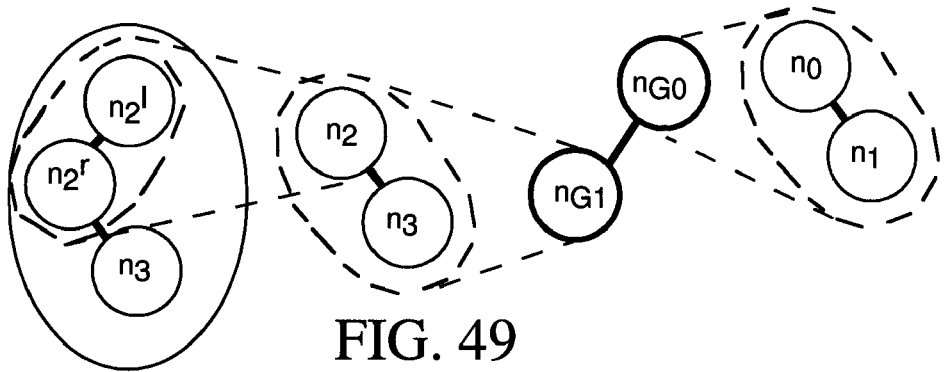
FIG. 49 depicts an HB*-tree representing a placement having a Type I irregularly rectilinear boundary.
Figure 50:
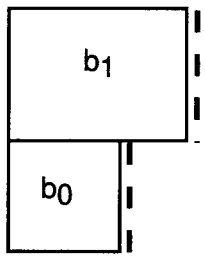
FIGS. 50-52 are simplified, progressively plan views of placements relative to the HB*-tree of FIG. 49.
Figure 51:
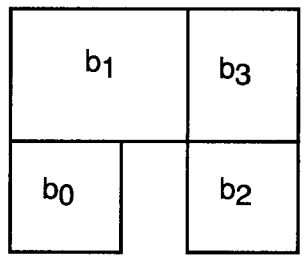
Figure 52:
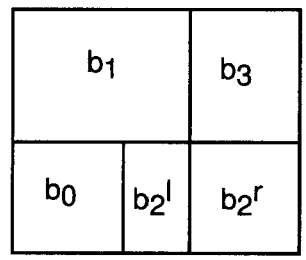

FIGS. 49-52 illustrate HB*-tree packing relative to a Type I vertical irregularly rectilinear boundary. FIG. 49 shows an HB*-tree representing the placement of two proximity groups G0={b0, b1} and G1={b2, b3}. FIG. 50 shows a resulting placement after packing the HB*-tree in nG0. FIG. 51 show a resulting placement after packing the HB*-tree in nG1, and FIG. 52 a resulting placement after packing the modified HB*-tree by splitting b2 into two sub-blocks b'2 and b''2.

Figure 53:
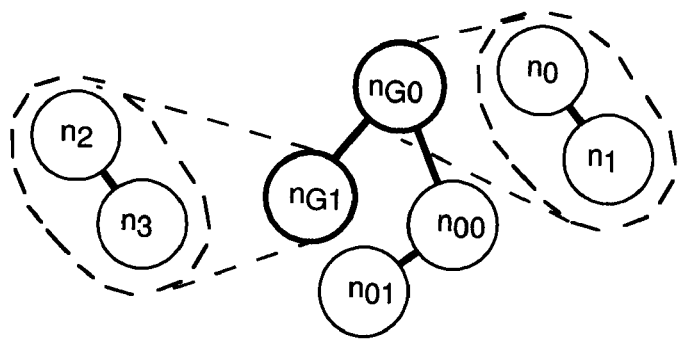
FIG. 53 is an HB*-tree representing a placement having a Type II irregularly rectilinear boundary.
Figure 54:
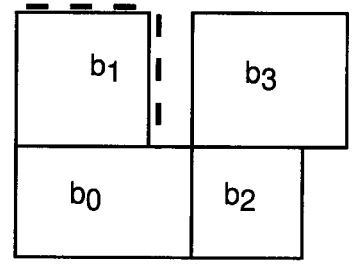
FIG. 54 is a simplified plan view of a placements relative to the HB*-tree of FIG. 53.

FIGS. 53 and 54 illustrate HB*-tree packing relative to a Type II vertical irregularly rectilinear boundary. FIG. 53 shows an HB*-tree representing the placement of two proximity groups G0={b0, b1} and G1={b2, b3} and FIG. 54 shows a resulting placement after packing the HB*-tree in FIG. 53.

Figure 55:
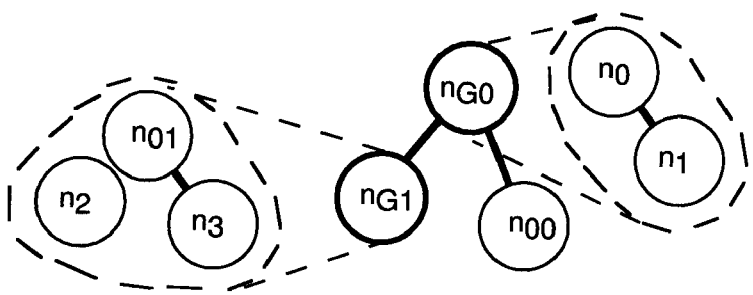
FIG. 55 depicts a modified version of the HB*-tree of FIG. 53.
Figure 56:
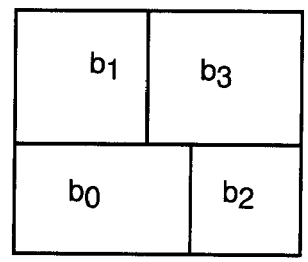
FIG. 56 is a simplified plan view of a placements relative to the HB*-tree of FIG. 55.

FIGS. 55 and 56 illustrate a modified HB*-tree for a placement having a vertical irregularly rectilinear boundary. FIG. 56 depicts a placement having an irregularly rectilinear boundary reflecting the packed HB*-tree shown in FIG. 55.

Simulated Annealing

Equation [1] defines a suitable cost function, $\phi(P)$, that can be used as a measure of the quality of a placement; the lower the cost, the better the placement. In Equation [1], $\alpha$, $\beta$, and $\gamma$ are user-specified parameters, AP is the area of the bounding rectangle for the placement, and WP is wire length.

$$\phi(P) = \alpha \times AP + \beta \times WP(\text{net}_{signal}) + \gamma \times WP(\text{net}_{power}) \qquad [1]$$

Figure 57:
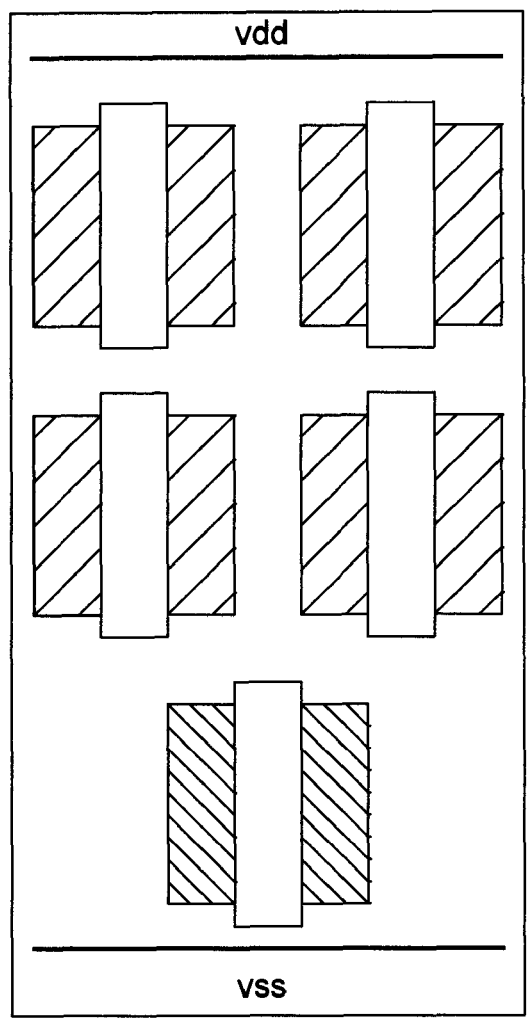
FIG. 57 is a simplified plan view of a placement for devices forming a device module in which power lines are in horizontal directions.
Figure 58:
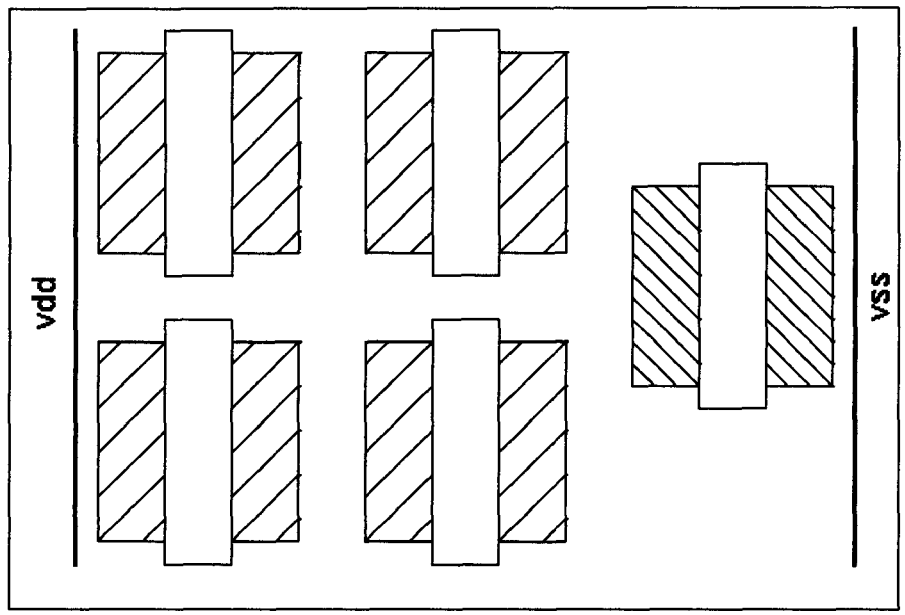
FIG. 58 is a simplified plan view of a placement for devices forming a device module in which power lines are in vertical directions.

The placement tool uses half-perimeter wire length (HPWL) to estimate wire lengths for nets conveying signals. For power nets, the placement tool estimates wire length as the distance between the power line and each connected device module. In analog cell design, the power lines usually lie on the boundaries of an analog cell. FIGS. 57 and 58 illustrate alternative power line topologies for an analog cell. FIG. 57 depicts an example placement for devices forming the cell when case power lines are in horizontal directions at top and bottom of cell boundaries. FIG. 58 depicts an example placement for devices forming the cell when case power lines are in vertical directions at right and left cell boundaries.

The placement tool creates a sequence of trial placements by iteratively perturbing an HB*-tree placement, uses the cost function to evaluate each trial placements, and selects the trial placement having the lowest cost function as the final placement. The placement tool in accordance with the invention can apply any of the following operations to perturb an ASF-B*-tree:

Op1: Rotate a device module.
Op2: Reposition a node.
Op3: Swap two nodes.
Op4: Change a representative.
Op5: Convert a symmetry type.

Perturbations Op1, Op2 and Op3 are employed in prior art non-hierarchal, B*-tree based systems that employ simulated annealing. A placement tool in accordance with the invention employs a hierarchical HB*-tree representation, has a higher probability of selecting non-hierarchy nodes for perturbation because rotating, moving or swapping a hierarchical node can produce a larger change from one solution to the next than a similar perturbation to a non-hierarchal node and because large changes between successive solutions can deteriorate solution quality during the simulated annealing process. Due to the special structure of the HB*-tree, the placement tool cannot move a non-hierarchy node to the right child of a hierarchy node or to the left child of a contour node. The placement tool always moves contour nodes with their hierarchy node.

A placement tool in accordance with the invention that employs a hierarchical, ASF-B*-tree also employs perturbations Op4 and Op5. The placement tool can change a representative (Op4) of a symmetry pair or a self-symmetry device module to optimize wire length without changing symmetry island area. There are four representative change cases:

Case 1: Change a representative of a symmetry pair in a 1D symmetric placement.
Case 2: Change a representative of a symmetry pair in a 2D symmetric placement.
Case 3: Change a representative of a self-symmetry device module in 1D symmetric placement.
Case 4: Change a representative of a self-symmetry device module in 2D symmetric placement.

In Case 1, for a symmetry pair $(b_i, b_i')$, the placement tool can simply change the representative from $b_i$ to $b_i'$ or from $b_i'$ to $b_i$. In Case 2, there are four representatives for a symmetry pair, and two representatives for each device module. The placement tool changes the representative from one in the current device module to one of the representatives in the other device module of the symmetry pair. For Cases 3 and 4, changing the representative of a self-symmetry device module is similar to the operation of rotation or flip.

There are six a symmetry type conversion cases (Op5):
Case 1: 1D vertical to horizontal symmetry.
Case 2: 1D horizontal to vertical symmetry.
Case 3: 1D vertical symmetry to 2D symmetry.
Case 4: 1D horizontal symmetry to 2D symmetry.
Case 5: 2D symmetry to 1D vertical symmetry.
Case 6: 2D symmetry to 1D horizontal symmetry.

Figure 59:
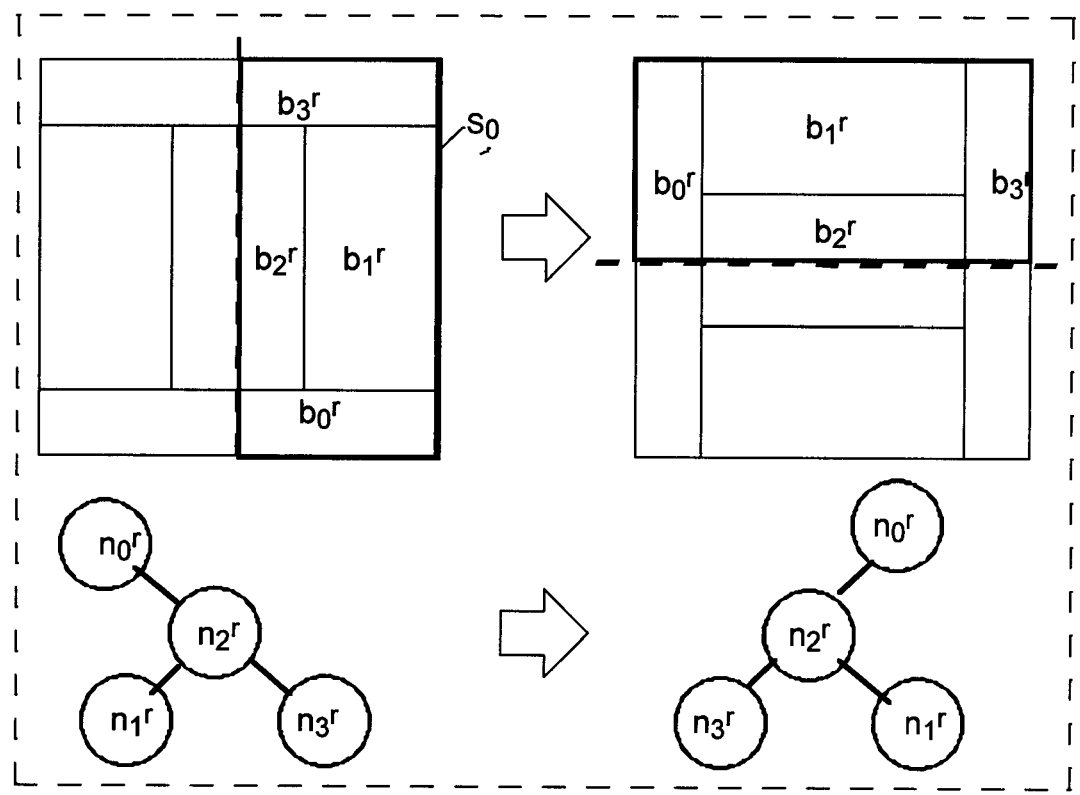
FIG. 59 illustrates a vertical to horizontal symmetry conversion of an ASF-B* tree and simplified plan view of their corresponding placements.
Figure 60:
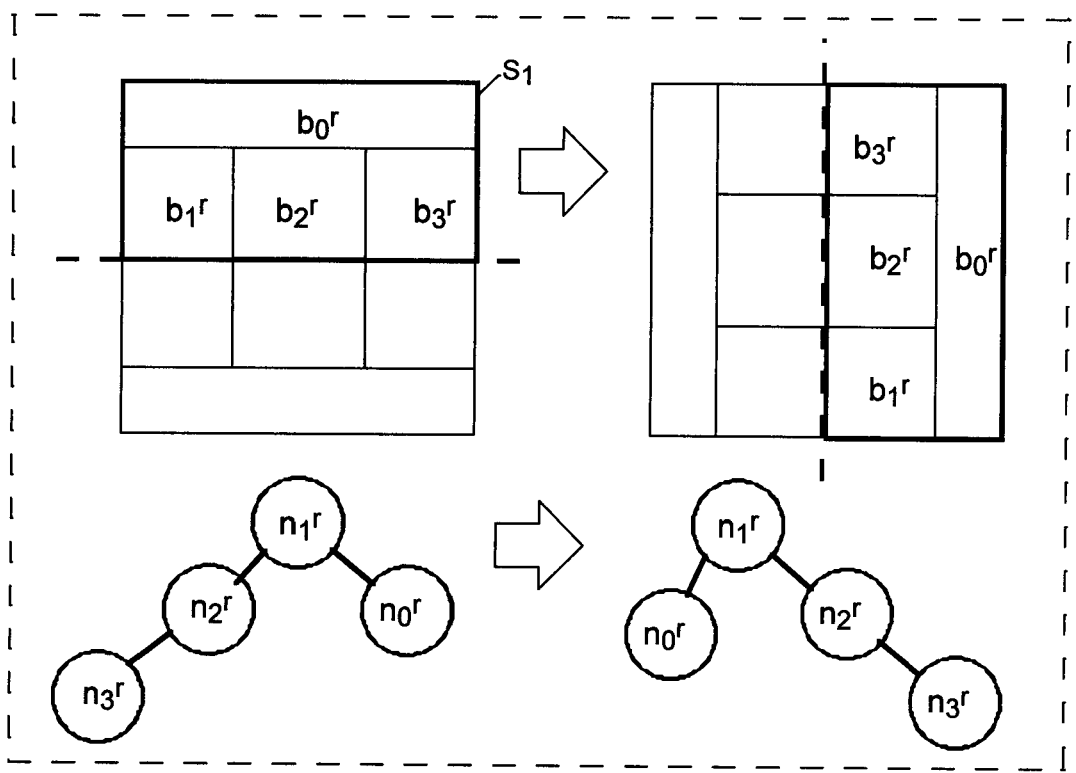
FIG. 60 illustrates a horizontal to vertical symmetry conversion of an ASF-B*-tree and simplified plan view of their corresponding placements.

For Cases 1 and 2, to convert the symmetric placement between two 1D symmetry types, the placement tool rotates each device module and then swaps the left and the right children of each node. FIG. 59 shows an example of Case 1, where a symmetry island $S_O$ having vertical symmetry is rotated so that it has horizontal symmetry, and FIG. 60 shows an example of Case 2, wherein a symmetry island $S_1$ having horizontal symmetry is rotated so that it exhibits vertical symmetry. FIGS. 59 and 60 also show the corresponding changes to the ASF-B*-tree representations of the symmetry islands For Cases 3 and 4, the placement tool first determines whether there is only one self-symmetry device module. To convert the symmetric placement from 1D symmetry to 2D symmetry, the placement tool re-determines the representative of each symmetry pair and self-symmetry device module and then rebuilds the ASF-B*-tree.

Figure 61:
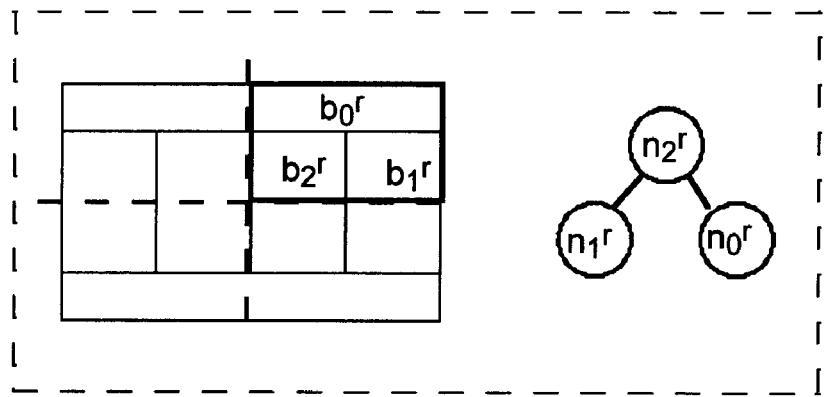
FIG. 61-63 illustrate ASF_B*-trees and simplified plan view of their corresponding placements.

In Cases 5 and 6, to convert the symmetric placement from 2D symmetry to 1D symmetry type, the placement tool tries to keep the tree structure while updating each representative for the converted symmetry type. FIG. 61 shows an example 2D symmetric placement, which can be converted to a 1D vertical symmetry placement as shown in FIG. 62 or to a 1D horizontal symmetry placement shown in FIG. 63.

Figure 62:
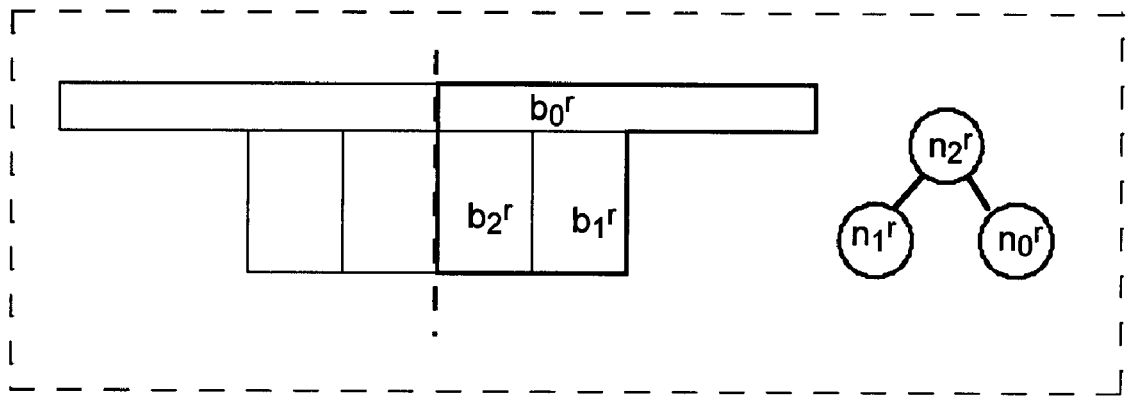
Figure 63:
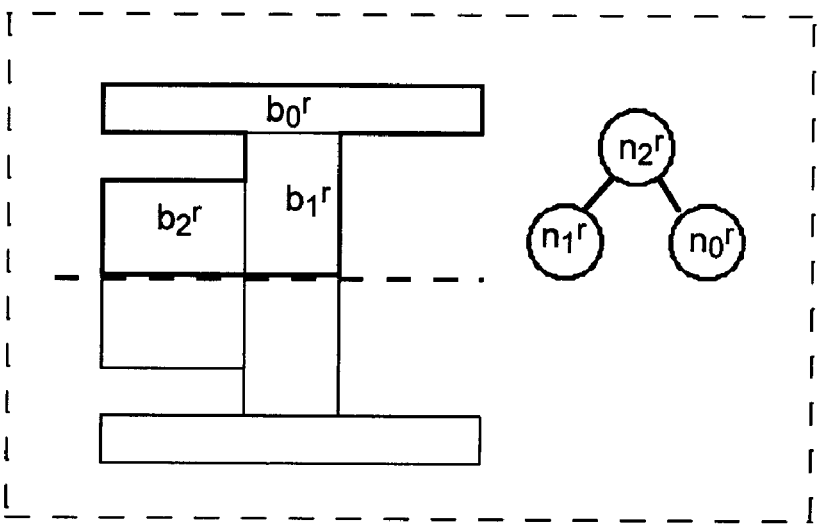

Although the topology of corresponding HB-tree representation as shown in each of FIGS. 61-63 does not change, the stored contour information does change as a result of Case 5 and 6 conversions. When an ASF-B*-tree is perturbed, the number of the corresponding contour nodes in the HB*-tree can change and the placement tool may have to update the tree structure accordingly. When the number of contour nodes representing the horizontal contour segments of the symmetry island increases, the structure of the HB*-tree remains unchanged. However, if the number of contour nodes decreases, other nodes in the HB*-tree may not have parents, so the placement tool reassigns new parent nodes to such "dangling nodes". To keep the relative placement topology before and after perturbing an ASF-B*-tree, the placement tool first finds the nearest contour node for each dangling node. If the nearest contour node has no right child, it is the parent of the dangling node, and the dangling node will be its right child. If the nearest contour node has a right child, we continuously traverse the leftmost-skewed child of the right child. The leftmost-skewed child will be the parent of the dangling node, and the dangling node is assigned to its left child. It takes amortized constant time to update the contour related nodes.

FIGS. 64 and 65 show an example of updating contour related nodes. Initially, there are five contour nodes $n_{00}$-$n_{04}$ in the HB*-tree of a symmetry group as shown in FIG. 64, but after perturbing the ASF-B*-tree of the symmetry group, contour nodes $n_{03}$ and $n_{04}$ disappear, and nodes $n_5$ and $n_8$ become dangling nodes. The placement tool first finds the nearest contour node of $n_5$, which is $n_{02}$, and since $n_{02}$ has no right child, the placement tool simply designates $n_5$ as the right child and $n_{02}$ as the parent of $n_5$. The placement tool then searches the nearest contour node of $n_8$, which is also $n_{02}$. Since $n_{02}$ already has the right child $n_5$, the tool searches the most left-skewed child, which is $n_6$. The tool designates $n_6$ as the parent of $n_8$, and $n_8$ as the left child of $n_6$.

FIG. 65 shows the result of the contour update.

Hierarchical Perturbation

HB*-tree perturbation operations such as rotating one device module, swapping two hierarchy nodes, moving a hierarchy node to another place, and so on have been discussed above. Before selecting a node from an HB*-tree to perform one of the perturbations, the placement tool selects either the top-level HB*-tree or any other HB*-tree in each hierarchy node. The probability of selecting an HB*-tree for perturbation is proportional to its size.

Placement Algorithm

Figure 66:
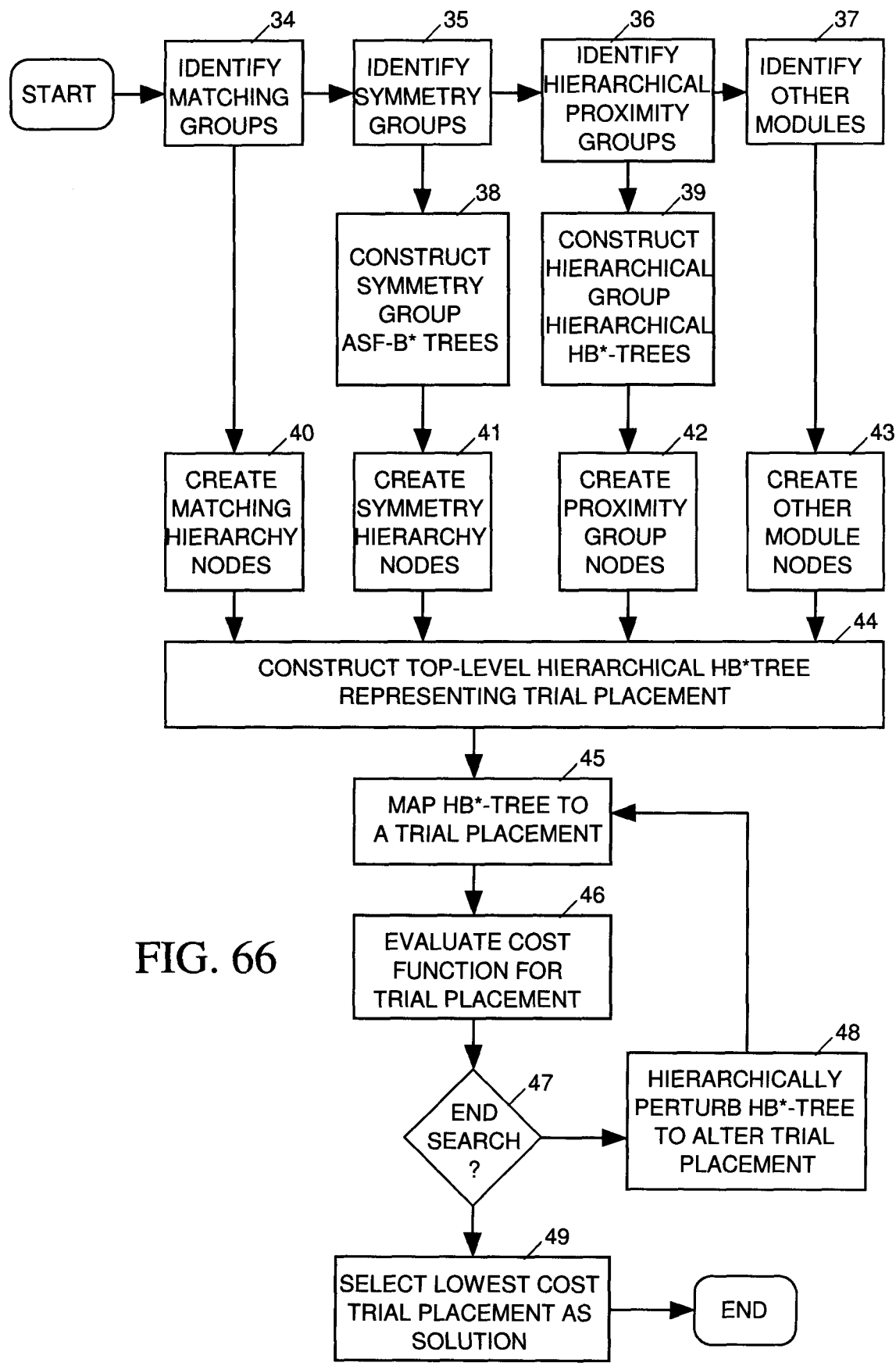
FIG. 66 is a data flow diagram illustrating an example of a placement method in accordance with the invention.

FIG. 66 is a data flow diagram illustrating a method in accordance with the invention enabling a placement tool place devices within an IC layout for an IC described by a netlist. The method ensures that each symmetry group placement satisfies a set of symmetric placement constraints on the symmetry group and that each symmetry group forms a symmetry island wherein device elements form a connected placement. The method also ensures that each proximity group placement satisfies the proximity placement constraint on the proximity group such that each device module node in the proximity group is proximally placed. The method also satisfies constraints on matching groups. The method searches for an optimal placement that minimizes a value of a cost function that is a measure of placement quality.

The placement tool initially identifies each matching group (step 34), each symmetry group (step 35), and each hierarchical cluster group (step 36) within the IC described by the netlist. The placement tool constructs a packed AFS-B* tree for each symmetry group (step 38) characterizing the symmetry group as a symmetry island satisfying all symmetry constraints placed on the symmetry group, and creates a separate hierarchical HB*-tree node to represent each symmetry island (step 41). The placement tool also constructs a hierarchical HB*-tree in bottom-up fashion to represent each hierarchical proximity group (step 39) and creates an HB*-tree node for the upper level HB*-tree (step 42). The placement tool further constructs a hierarchical HB*-tree node for each matching group (step 40). The placement tool also identifies each device included in the netlist that is not a part of any constraint group (step 37) and creates an HB*-tree node for that device (step 43).

The placement tool then assembles all of the hierarchical and other nodes created (steps 40-43) into the top-level HB*-tree representing a packed trial placement (step 44) in which all symmetry groups are symmetry islands satisfying symmetry constraints place on the symmetry groups, and all hierarchical proximity groups satisfy proximity constraints on the hierarchical proximity groups, and all matching groups satisfy matching constraints on the matching groups. The placement tool generates a placement based on that HB*-tree representation (step 45) and then evaluates the cost function for that placement (step 46). If the placement tool is not ready to end its search for a lowest cost placement (step 47), it perturbs the last generated HB*-tree using any of the perturbations discussed above (step 48) and then repeats steps 45-47, thereby evaluating the cost function for the placement represented by the perturbed HB*-tree. The placement tool continues to loop through steps 45-48 iteratively perturbing the HB*-tree in various ways and evaluating the cost function for the resulting placement until at step 47 it decides to end its search and select the lowest cost placement it found as the final placement (step 49).

Thus has been shown and described a method in accordance with the invention that a placement tool can use to generate a placement for an analog IC. The method is advantageous because using AFS-B*-trees within a hierarchical HB*-tree representation of an IC placement to represent symmetry groups as symmetry islands allows a placement tool to find a low cost IC layout meeting matching, symmetry and proximity placement constraints with less processing time than a conventional placement using a non-hierarchal B*-tree representation of the IC.

The invention claimed is:

1. Non-transitory computer-readable media containing instructions, which when read and executed by a computer, cause the computer to execute a method for selecting a placement for device modules that are to form an integrated circuit (IC) described by an IC design, wherein the selected placement satisfies a set of placement constraints, wherein the method comprises the steps of:
   a. processing the IC design to define a multiple-level hierarchy of groups, wherein each group consists of elements that are subject to one of the placement constraints, and wherein at least one element of at least one group residing at an upper level of the hierarchy comprises at least one of the groups residing at a lower level of the hierarchy and at least one element of at least one group residing at a lower level of the hierarchy comprises at least one of the device modules;
   b. generating a hierarchical representation of a trial placement for the IC comprising a separate group representation for each group of the hierarchy and a separate device representation for each of the device modules not included in any of the groups, wherein each group representation defines relative positions within the IC of the elements of the group that are consistent with the placement constraint on the elements of the group and each device representation defines a relative position of the device module it represents;
   c. iteratively perturbing the hierarchical representation to generate a sequence of hierarchical representations of trial placements for the IC design;
   d. separately evaluating a cost function for each trial placement that is a measure of placement quality, and
   e. based on cost function evaluations carried out at step d, selecting a best one of the trial placements generated at step c as the selected placement.

2. The computer-readable media in accordance with claim 1
   wherein the hierarchical representation of a trial placement for the IC generated at step b is a first HB*-tree comprising a plurality of nodes representing separate ones of the devices modules and groups.

3. The computer-readable media in accordance with claim 2
   wherein one of the placement constraints is a symmetry constraint, and
   wherein a node of the first HB*-tree comprises an automatically symmetric-feasible B*-tree (ASF-B*-tree) representation of a placement for a set of the device modules forming a symmetry group that is subject to the symmetry constraint.

4. The method in accordance with claim 3
   wherein the ASF-B*-tree defines a symmetry island placement for all of the device modules forming the symmetry group in which each device module of the symmetry group abuts at least one other device module of the symmetry group such that all device modules of the symmetry group form a connected placement.

5. The computer-readable media in accordance with claim 4
   wherein the symmetry island placement defined by an ASF-B*-tree representing the symmetry group about an axis of symmetry, and
   wherein the ASF-B*-tree represents positions of device modules of the symmetry group residing on only one side of the axis of symmetry.

6. The computer-readable media in accordance with claim 5 wherein at least one perturbation of the hierarchal representation carried out at step c comprises altering the ASF-B*-tree to one of rotating a device module, repositioning a device module, and swapping positions of two device modules within the trial placement defined by the ASF-B*-tree.

7. The computer-readable media in accordance with claim 4 wherein at least one perturbation of the hierarchal representation carried out at step c comprises altering the ASF-B*-tree to alter a type of the symmetry of the symmetry island it defines from any one of vertical, horizontal, and two-dimensional symmetry to any other one of vertical, horizontal and two-dimensional symmetry.

8. The computer-readable media in accordance with claim 3
   wherein at least one of the placement constraints is a hierarchical symmetry constraint,
   wherein at least one node of the first ASF-B*-tree comprises a second ASF-B*-tree representation of a placement for a set of the device modules that are subject to the hierarchal symmetry constraint.

9. The computer-readable media in accordance with claim 8 wherein step c comprises hierarchically packing the second ASF-B*tree.

10. The computer-readable media in accordance with claim 3
    wherein one of the placement constraints is a matching constraint and
    wherein a node of the first ASF-B*-tree comprises a representation of a placement for a set of the device modules that are subject to the matching constraint.

11. The computer-readable media in accordance with claim 2 wherein at least one perturbation of the hierarchal representation carried out at step c comprises altering the HB*-tree to one of rotating a device module, repositioning a device module, and swapping positions of two device modules within the trial placement defined by the HB*-tree.

12. The computer-readable media in accordance with claim 2,
    wherein the HB*-tree comprises nodes representing device modules and nodes representing symmetry island edges.

13. The computer-readable media in accordance with claim 2
    wherein one of the placement constraints is a hierarchical proximity constraint,
    wherein a node of the first HB*-tree comprises a second HB*-tree representation of a placement for a set of the device modules that are subject to the hierarchal proximity constraint.

14. The computer-readable media in accordance with claim 10 wherein step c comprises hierarchically packing the second HB*tree.

15. The computer-readable media in accordance with claim 2
    wherein one of the placement constraints is a matching constraint and
    wherein a node of the first HB*-tree comprises a representation of a placement for a set of the device modules that are subject to the matching constraint.

* * * * *